United States Patent
Kemmochi et al.

(10) Patent No.: US 8,582,547 B2
(45) Date of Patent: Nov. 12, 2013

(54) HIGH FREQUENCY CIRCUIT, HIGH FREQUENCY COMPONENT AND COMMUNICATION DEVICE

(75) Inventors: Shigeru Kemmochi, Saitama (JP); Keisuke Fukamachi, Saitama (JP); Kazuhiro Hagiwara, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 708 days.

(21) Appl. No.: 12/520,085

(22) PCT Filed: Dec. 18, 2007

(86) PCT No.: PCT/JP2007/074336
§ 371 (c)(1),
(2), (4) Date: Dec. 24, 2009

(87) PCT Pub. No.: WO2008/075691
PCT Pub. Date: Jun. 26, 2008

(65) Prior Publication Data
US 2010/0091752 A1    Apr. 15, 2010

(30) Foreign Application Priority Data

Dec. 19, 2006  (JP) .................... 2006-341217
Dec. 28, 2006  (JP) .................... 2006-353755
Jul. 18, 2007  (JP) .................... 2007-186749

(51) Int. Cl.
*H04B 1/44*    (2006.01)

(52) U.S. Cl.
USPC ........................................... 370/343

(58) Field of Classification Search
None
See application file for complete search history.

(56) References Cited

U.S. PATENT DOCUMENTS 5,926,466 A   7/1999 Ishida et al.
6,728,517 B2 * 4/2004 Sugar et al. .............. 455/73
(Continued)

FOREIGN PATENT DOCUMENTS

JP  08-321738 A   12/1996
JP  2001-203601   7/2001
(Continued)

OTHER PUBLICATIONS

Office Action issued by Japanese Patent Office on Nov. 30, 2010, in Japanese patent application No. 2008-550157. Partial.

(Continued)

*Primary Examiner* — John Blanton
*Assistant Examiner* — Alan Lindenbaum
(74) *Attorney, Agent, or Firm* — Sughrue Mion, PLLC

(57) ABSTRACT

An inventive high frequency circuit includes a switch circuit (SPDT1), connected to an antenna terminal (Ant1), using a field-effect transistor for switching between a connection with first to third transmitting terminals (Tx1-1, Tx2-1, Tx3-1) and a connection with first to third receiving terminals (Rx1-1, Rx2-1, Rx3-1); a transmitting-side triplexer (Trip1) for branching a transmitting path connected to the switch circuit into transmitting paths of first to third frequency bands; and a receiving-side triplexer (Trip2) for branching a receiving path connected to the switch circuit into receiving paths of the first to third frequency bands. The switch circuit can be formed as an IC to downsize the circuit. For example, in constructing the high frequency circuit with a laminated module using a ceramic laminated substrate or the like, particularly when the number of triplexers occupying a large space is large, the switch circuit is formed as an IC and mounted on the laminated body, whereby the whole structure can be downsized.

17 Claims, 18 Drawing Sheets

(56) References Cited

U.S. PATENT DOCUMENTS

| | | | |
|---|---|---|---|
| 7,495,528 B2* | 2/2009 | Fukunaga | 333/132 |
| 7,773,956 B2* | 8/2010 | Fukamachi et al. | 455/78 |
| 2003/0092397 A1* | 5/2003 | Uriu et al. | 455/82 |
| 2004/0127182 A1* | 7/2004 | Hayashi | 455/193.1 |
| 2004/0266378 A1* | 12/2004 | Fukamachi et al. | 455/188.1 |

FOREIGN PATENT DOCUMENTS

| | | |
|---|---|---|
| JP | 2002-141764 | 5/2002 |
| JP | 2003-8385 | 1/2003 |
| JP | 2003-143033 | 5/2003 |
| JP | 2003-152588 | 5/2003 |
| JP | 2004-200853 | 7/2004 |
| JP | 2005-020381 | 1/2005 |
| JP | 2005-57342 | 3/2005 |
| JP | 2005-73086 | 3/2005 |
| JP | 2005-124119 | 5/2005 |
| JP | 2005-354407 A | 12/2005 |
| JP | 2006-128881 A | 5/2006 |
| JP | 2006-304081 | 11/2006 |
| JP | 2006-332980 | 12/2006 |
| JP | 2006-333258 | 12/2006 |
| WO | WO 2005/088833 A1 | 9/2005 |
| WO | WO 2006/003959 A1 | 1/2006 |
| WO | WO 2006/006959 | 1/2006 |

OTHER PUBLICATIONS

Office Action issued by Japanese Patent Office on Sep. 7, 2010, in Japanese patent application No. 2008-550157.

Japanese Office Action issued on Aug. 6, 2013 in Japanese Application No. 2011-015070.

* cited by examiner

HIGH FREQUENCY CIRCUIT, HIGH FREQUENCY COMPONENT AND COMMUNICATION DEVICE

CROSS REFERENCE TO RELATED APPLICATIONS

This application is a national phase application based on PCT/JP2007/074336, filed Dec. 18, 2007, which claims the priority of Japanese Patent Application Nos. 2006-341217, filed Dec. 19, 2006, 2006-353755, filed Dec. 28, 2006, and 2007-186749, filed Jul. 18, 2007, the content of all of which is incorporated herein by reference.

TECHNICAL FIELD

The present invention relates to a radio communication device that performs radio transmission between electronic/electrical devices, and more particularly to a high frequency circuit which can handle at least three different frequency bands,' a high frequency component including the high frequency circuit, and a communication device using the high frequency component.

BACKGROUND ART

In present days, data communication based on wireless LAN typified by IEEE802.11 is in widespread use. Data communication using wireless LAN is used as signal transmitting means which replaces wired communication using in a personal computer (PC), PC peripheral devices such as printer, hard disk and broadband router, FAX, refrigerator, standard-definition television (SDTV), high-definition television (HDTV), camera, video camcoder, electronic device such as mobile phone, signal transmitting means in an automobile and an airplane and the like; and wireless data transmission is performed between these electronic/electrical devices.

IEEE802.11a, a wireless LAN standard, supports high-speed data communication of a maximum speed of 54 Mbps using the OFDM (Orthogonal Frequency Division Multiplexing) modulation scheme, and uses a band of 5 GHz as the frequency band thereof. IEEE802.11b supports high-speed data communication of 5.5 Mbps or 11 Mbps using the DSSS (Direct Sequence Spread Spectrum) scheme, and uses the ISM (Industrial Scientific and Medical) band of 2.4 GHz which can be freely used without radio license. IEEE802.11g supports high-speed data communication of a maximum speed of 54 Mbps using the OFDM modulation scheme and uses, similarly to IEEE802.11b, a band of 2.4 GHz.

A high frequency circuit used in a multiband communication device using such wireless LAN includes: one antenna capable of transmitting and receiving for two communication systems (IEEE802.11a and IEEE802.11b and/or IEEE802.11g) which are different in communication frequency band; and a high frequency switch for switching between a connection with a transmitting-side circuit and a connection with a receiving-side circuit. Using the high frequency switch, switching is performed between the transmitting-side circuit and receiving-side circuit for the two communication systems.

Recently, WiMAX (IEEE802.16-2004, IEEE802.16e-2005 and the like) has been proposed as high-speed radio communication standard which covers a communication distance of several kilometers or so. For example, the use of the standard is expected as a technique for covering "the last one mile" of optical communication. WiMAX uses as the frequency band, three bands of 2.5 GHz, 3.5 GHz and 5.8 GHz. Thus, when a high frequency component is configured which covers all the three frequency bands of WiMAX, or when a high frequency component is configured which covers the three frequency bands in a combination of WiMAX and wireless LAN, path branching must be performed for transmit and received signals of the three frequency bands.

As a technique of branching signals of three different frequencies, for example, a composite LC filter circuit has been disclosed in Japanese Patent Laid-Open No. 2003-8385 (Patent Document 1). Also, a triplexer for branching signals of three different frequencies has been disclosed in Japanese Patent Laid-Open No. 2005-57342(Patent Document 2). According to Patent Document 1, triplexer lines are arranged between filters constituting a triplexer and input/output terminals to modify the triplexer performance.

DISCLOSURE OF THE INVENTION

Problems to be Solved by the Invention

Japanese Patent Laid-Open No. 2003-8385(Patent Document 1) discloses an LC filter circuit (triplexer) that branches signals of three different frequencies, but does not disclose a circuit configuration of the preceding and rear stages of the LC filter circuit. As the number of frequency bands used increases, the size of circuits used for transmission/reception and switching grows; thus when the filter circuit is used as a front-end module for communication device, the cost must be reduced and also particularly the structure for switching between transmission and reception, including the triplexer, must be reduced.

However, according to the related art, as with the invention described in Patent Document 1, in transmission and reception for a mobile phone, including reception of GPS signals, a configuration is assumed which branches signals of three different frequencies; thus a configuration for performing transmission and reception in all the three different frequency bands has not been fully studied. Accordingly, downsizing and cost reduction of the front-end module has not been satisfactorily achieved.

Further, in the triplexer, it is required that signal of the passing frequency band be permitted to pass through the triplexer with low loss but a signal of another frequency band be substantially blocked; as the frequency bands used are close to each other, the requirement becomes difficult to meet. Consequently, when the frequency bands used are close as in WiMAX using frequency bands of 2.5 GHz, 3.5 GHz and 5.8 GHz, the triplexer used must have excellent triplexer characteristic. Further, the frequency for which a surface acoustic wave (SAW) filter can be used is typically limited to 2 GHz or less; thus it is difficult to construct a triplexer which handles three frequencies of 2.5 GHz, 3.5 GHz and 5.8 GHz by use of an SAW filter.

For the above demand, it is difficult for the configuration of Patent Document 1 to provide satisfactory triplexer characteristic. More specifically, when a phase adjustment circuit is used alone, signals of two frequency bands other than the passing frequency band cannot be substantially blocked.

To address the above problems, the present invention has an object to provide a configuration capable of achieving cost reduction and downsizing for a high frequency circuit and high frequency component used in a radio device capable of using at least three or more frequency bands, and also an object to achieve cost reduction and downsizing of a communication device using the high frequency circuit and high frequency component.

The present invention has a second object to provide a configuration capable of achieving excellent triplexer characteristic in a triplexer which branches a communication signal into three different frequency bands, and also provide a high frequency circuit, high frequency component and communication device using the triplexer.

Means for Solving the Problems

To address such problems, according to a first invention, there is provided a high frequency circuit used in a communication device that performs radio communication using at least a first frequency band, a second frequency band higher than the first frequency band, and a third frequency band higher than the second frequency band. The high frequency circuit includes: an antenna terminal to be connected to an antenna; a first transmitting terminal for inputting a transmit signal of the first frequency band; a second transmitting terminal for inputting a transmit signal of the second frequency band; a third transmitting terminal for inputting a transmit signal of the third frequency band; a first receiving terminal for outputting a received signal of the first frequency band; a second receiving terminal for outputting a received signal of the second frequency band; a third receiving terminal for outputting a received signal of the third frequency band; a switch circuit, connected to the antenna terminal, using a field-effect transistor for switching between a connection with the first, second and third transmitting terminals and a connection with the first, second and third receiving terminals; a transmitting-side triplexer that branches a transmitting path connected to the switch circuit into transmitting paths of the first, second and third frequency bands; and a first receiving-side triplexer that branches a receiving path connected to the switch circuit into receiving paths of the first, second and third frequency bands.

With such configuration, switching between transmission and reception can be performed using the one switch circuit; thus in the high frequency circuit that performs frequency band separation of at least three frequency bands and switching between transmission and reception, when the triplexer performs the function of branching the transmitting path and receiving path into the paths of respective frequency bands, any switch for the branching is not needed, so a low-cost and small-sized high frequency circuit can be provided. For example, it is possible to provide a high frequency circuit suitable for use in a front-end module of a communication device which uses WiMAX using frequency bands of 2.5 GHz, 3.5 GHz and 5.8 GHz, or in a front-end module of a communication device which uses both WiMAX and wireless LAN.

In the high frequency circuit, the transmitting-side triplexer and/or the receiving-side triplexer preferably includes a low-pass filter circuit that permits passing of a signal of the first frequency band, a band-pass filter circuit that permits passing of a signal of the second frequency band, and a high-pass filter circuit that permits passing of a signal of the third frequency band. With this configuration, the number of filters constituting the triplexer can be minimized.

Alternatively, in the high frequency circuit, the transmitting-side triplexer and/or the receiving-side triplexer may include a first diplexer that separates signals of the first and second frequency bands from a signal of the third frequency band, and a second diplexer that is connected to the first diplexer and separates a signal of the first frequency band from a signal of the second frequency band. Since the diplexer is smaller in circuit size than the triplexer, desired characteristics can be achieved more easily.

In the high frequency circuit, the branching function of the triplexer is preferably configured using an inductance element and capacitance element. With such configuration, the structure can be simplified, compared to an SAW filter or the like having a complex structure. Further, the inductance element and capacitance element can be constructed using electrode patterns in a laminated substrate, so this configuration is suitable for a case where the high frequency circuit is constructed on a laminated substrate to achieve downsizing.

In the high frequency circuit, it is preferable that a first amplifier circuit is connected to the first transmitting terminal, a second amplifier circuit is connected to the second transmitting terminal, and a third amplifier circuit is connected to the third transmitting terminal. With such configuration, the amplifier circuits and triplexer can be designed in an integrated manner, so a matching circuit arranged between the amplifier circuit and triplexer can be designed easily.

In the high frequency circuit, it is preferable that a first band-pass filter circuit is arranged on an input-terminal side of the first amplifier circuit, a second band-pass filter is arranged on an input-terminal side of the second amplifier circuit, and a third band-pass filter circuit is arranged on an input-terminal side of the third amplifier circuit. With such configuration, an unwanted noise signal from the input-terminal side can be prevented from entering the amplifier circuit.

In the high frequency circuit, it is preferable that a fourth band-pass filter circuit is arranged on an output-terminal side of the first amplifier circuit, a first low-pass filter circuit is arranged on an output-terminal side of the second amplifier circuit, and a second low-pass filter circuit is arranged on an output-terminal side of the third amplifier circuit. In combination with the triplexer, such configuration can reduce noise of a frequency lower than a frequency band used and noise of a frequency higher than the frequency band used while suppressing an increase in insertion loss of transmitting path.

In the high frequency circuit, a detection circuit is preferably arranged between the transmitting-side triplexer and the switch circuit. With such configuration, when an output of the detection circuit is fed back, the output power from the amplifier circuit can be regulated. Further, the single detection circuit handles a plurality of frequency bands, so such configuration is suitable for achieving cost reduction and downsizing of the high frequency circuit.

In the high frequency circuit, a first low-noise amplifier circuit is preferably arranged between the first receiving-side triplexer and the switch circuit. Further, a first high-pass filter circuit is preferably arranged between the first low-noise amplifier circuit and the switch circuit. With such configuration, received signals of multiple frequency bands can be amplified by the single low-noise amplifier circuit, so the configuration is suitable for achieving cost reduction and downsizing of the high frequency circuit. Further, the arrangement of the high-pass filter in the preceding stage of the first low-noise amplifier circuit can reduce the amplitude of signal of a frequency lower than the first frequency band while suppressing an increase in insertion loss, so distortion by the low-noise amplifier circuit can be reduced.

In the high frequency circuit, it is preferable that a second low-noise amplifier circuit is arranged between the first receiving-side triplexer and the first receiving terminal, a third low-noise amplifier circuit is arranged between the first receiving-side triplexer and the second receiving terminal, and a fourth low-noise amplifier circuit is arranged between the first receiving-side triplexer and the third receiving terminal. Further, a second high-pass filter circuit is preferably arranged between the first receiving-side triplexer and the second low-noise amplifier circuit. With such configuration, the arrangement of the high-pass filter in the preceding stage of the second low-noise amplifier circuit which amplifies a received signal of the first frequency band, can reduce the amplitude of signal of a frequency lower than the first frequency band while preventing an increase in loss of the second and third frequency bands, so distortion by the low-noise amplifier circuit can be reduced.

A high frequency circuit may be configured which includes the above high frequency circuit acting as a first high frequency sub-circuit, and further includes a high frequency circuit acting as a second sub-high frequency circuit which includes: another antenna terminal connected to another antenna; a fourth receiving terminal for outputting a received signal of the first frequency band; a fifth receiving terminal for outputting a received signal of the second frequency band; a sixth receiving terminal for outputting a received signal of the third frequency band; and a second receiving-side triplexer that branches a receiving path connected to the another antenna terminal into receiving paths of the first, second and third frequency bands. With such configuration, a plurality of receiving paths are provided for one frequency band. Thus, the configuration can be used in an SIMO (single-input and multi-output) type high frequency circuit or an MIMO (multi-input and multi-output) type high frequency circuit.

In the second sub-high frequency circuit, it is preferable that a fifth low-noise amplifier circuit is arranged between the second receiving-side triplexer and the another antenna terminal, and a third high-pass filter is arranged between the fifth low-noise amplifier circuit and the another antenna terminal. With such configuration, in the second sub-high frequency circuit, received signals of multiple frequency bands can be amplified by the single low-noise amplifier circuit. Thus the configuration is suitable for achieving cost reduction and downsizing of the high frequency circuit. Further, the arrangement of the high-pass filter in the preceding stage of the fifth low-noise amplifier circuit can reduce the amplitude of signal of a frequency lower than the first frequency band while suppressing an increase in insertion loss, so distortion by the low-noise amplifier circuit can be reduced.

In the second sub-high frequency circuit, it is preferable that: a sixth low-noise amplifier circuit and a fourth high-pass filter circuit disposed between the sixth low-noise amplifier circuit and the second receiving-side triplexer are arranged in a receiving path of the first frequency band formed between the second receiving-side triplexer and the fourth receiving terminal; a seventh low-noise amplifier circuit is arranged in a receiving path of the second frequency band formed between the second receiving-side triplexer and the fifth receiving terminal; and an eighth low-noise amplifier circuit is arranged in a receiving path of the third frequency band formed between the second receiving-side triplexer and the sixth receiving terminal. With such configuration, in the second sub-high frequency circuit, the arrangement of the band-pass filter in the preceding stage of the sixth low-noise amplifier circuit which amplifies a received signal of the first frequency band, can reduce the amplitude of signal of a frequency lower than the first frequency band while preventing an increase in loss of the second and third frequency bands, so distortion by the low-noise amplifier circuit can be reduced.

In the high frequency circuit, the another antenna terminal and the second receiving-side triplexer are preferably connected via another switch circuit performing switching between connection state and non-connection state. With such configuration, when the another switch circuit is changed to non-connection state, the second receiving-side triplexer can be isolated from the another antenna terminal.

For the high frequency circuit, a configuration may be used in which there is included an input/output terminal for another communication system other than the communication system using the first, second and third frequency bands, wherein the switch circuit performs switching between a connection of the antenna terminal with the first, second and third transmitting terminals and a connection of the antenna terminal with the first, second and third receiving terminals and a connection of the antenna terminal with the input/output terminal for the another communication system. With such configuration, the switch circuit is provided with the terminal used for branching as well as the transmitting-side terminals and receiving-side terminals of the first to third frequency bands, whereby the input and output function of the another communication system is also performed. In the high frequency circuit, the another communication system is preferably Bluetooth.

The high frequency circuit preferably has a configuration in which a plurality of sub-transmitting terminals are further connected via a rear-stage switch circuit to at least one of the first, second and third transmitting terminals, and a plurality of Sub-receiving terminals are further connected via another rear-stage switch circuit to at least one of the first, second and third receiving terminals corresponding to at least one of the first, second and third transmitting terminals, and the rear-stage switch circuit changes connection between at least one of the first, second and third transmitting terminals and the a plurality of sub-transmitting terminals, and the another rear-stage switch circuit changes connection between at least one of the first, second and third receiving terminals and the a plurality of sub-receiving terminals. Such configuration implements a high frequency circuit which can be shared by a plurality of communication systems using the same frequency bands. That is, switching between the transmitting and receiving circuits can be performed according to the communication system by switching of the rear-stage switch circuit.

In the high frequency circuit, it is preferable that the communication system using the first frequency band is wireless LAN or WiMAX, the communication system using the second frequency band is WiMAX, and the communication system using the third frequency band is wireless LAN or WiMAX.

In the high frequency circuit, it is preferable that at least one of the transmitting-side triplexer and the receiving-side triplexer includes: a first band-pass filter unit, disposed in a first path between a common terminal and a first branching terminal, and permitting passing of a signal of the first frequency band; a second band-pass filter unit, disposed in a second path between the common terminal and a second branching terminal, and permitting passing of a signal of the second frequency band; and a third band-pass filter unit, disposed in a third path between the common terminal and a third branching terminal, and permitting passing of a signal of the third frequency band, and first, second and third parallel resonant circuits are arranged between the common terminal and the first, second and third band-pass filter units, respectively, and a phase adjustment circuit is arranged between the band-pass filter unit and the parallel resonant circuit in at least two of the first, second and third paths.

The triplexer has two blocking frequency bands while having a passing frequency band. When the parallel resonant circuits are arranged in the paths connected to the common terminal, a signal of another frequency band other than the passing frequency band can be blocked. Further, since the phase adjustment circuit is provided, it is possible to block a signal of another frequency band which the resonant circuit cannot block. With such configuration, a triplexer excellent in branching characteristic can be provided.

In the case of the first and third frequency bands which are on both sides among the frequency bands, or in the case of frequency bands being away from each other, there may be no need to arrange the phase adjustment circuit for one of the paths, depending on the impedance and the like of the band-pass filter connected in the rear stage. Consequently, it is preferable that the phase adjustment circuits are arranged in at least two of the paths; in order to achieve more excellent branching characteristic, it is more preferable that the phase adjustment circuits are arranged in all the first, second and third paths.

Particularly, in the triplexer, the phase adjustment circuits are preferably arranged in the first and second paths. The third path is a path of the highest frequency band, and has a phase such that the impedance of the band-pass filter connected in the rear stage is substantially open; thus, satisfactory triplexer characteristic may be achieved without the phase adjustment circuit. Consequently, when the phase adjustment circuits are arranged in the first and second paths, the triplexer can be downsized.

In the high frequency circuit, it is preferable that a transmission line acting as the phase adjustment circuit is arranged in the first and second paths, and a high-pass filter acting as the phase adjustment circuit is arranged between the band-pass filter unit and the parallel resonant circuit in the third path. Since the transmission line having a simple configuration is used as the phase adjustment circuit, the insertion loss of the triplexer is reduced.

When the electric length is adjusted by the length of the transmission line, so that the impedance of the line as integrated with the band-pass filter has a substantially open phase, the branching characteristic can be improved. Further, when the line width of the transmission line is varied, the transmission line can also serve as part of a matching circuit in the passing band. Also, when the high-pass filter is used, a branching circuit can be constructed which has the third frequency as the passing frequency and has sufficient attenuation at the first and second frequencies, and the impedance as seen from the common terminal has a substantially open phase in the first and second frequencies.

A high frequency component according to the present invention is one including the high frequency circuit; and the high frequency circuit is constructed using an integral laminate comprising pluralities of layers provided with pattern electrodes and elements mounted on a surface of the laminate. Since the high frequency circuit is integrated in the laminated body, the high frequency component can be downsized. The downsizing of the high frequency component contributes to reduction of insertion loss by line resistance.

In the high frequency component, it is preferable that the transmitting-side triplexer and the receiving-side triplexer are formed in the laminated body and each include a filter unit which permits passing of a signal of the first frequency band, a filter unit which permits passing of a signal of the second frequency band and a filter unit which permits passing of a signal of the third frequency band, and the filter units are arranged so as not to overlap each other as seen from a lamination direction of the laminate. With this filter arrangement, the filters can be isolated, and signal leak to another filter can be minimized, and insertion loss can be reduced.

In the high frequency component including the high frequency circuit using WiMAX and wireless LAN, it is preferable that the high frequency circuit is constructed using an integral laminate comprising pluralities of layers provided with pattern electrodes and elements mounted on a surface of the laminate, and the transmitting-side triplexer and the receiving-side triplexer are formed in the laminated body and each include a filter unit which permits passing of a signal of the first frequency band, a filter unit which permits passing of a signal of the second frequency band and a filter unit which permits passing of a signal of the third frequency band, and the filter units are arranged so that the wireless LAN filter unit of the transmitting-side triplexer and the WiMAX filter unit of the receiving-side triplexer are not brought into closest proximity to each other as seen from a lamination direction of the laminate, and the WiMAX filter unit of the transmitting-side triplexer and the wireless LAN filter unit of the receiving-side triplexer are not brought into closest proximity to each other as seen from a laminate direction of the laminated body. With such arrangement, it is possible to prevent a transmit signal of wireless LAN from leaking to the receiving path of WiMAX and working as interfering wave. Also, it is possible to prevent a transmit signal of WiMAX from leaking to the receiving path of wireless LAN and working as interfering wave.

According to a second invention, there is provided a high frequency circuit used in a communication device that performs radio communication using at least a first frequency band, a second frequency band higher than the first frequency band, and a third frequency band higher than the second frequency band. The high frequency circuit includes: an antenna terminal to be connected to an antenna; a first transmitting terminal for inputting a transmit signal of the first frequency band; a second transmitting terminal for inputting a transmit signal of the second frequency band; a third transmitting terminal for inputting a transmit signal of the third frequency band; a first receiving terminal for outputting a received signal of the first frequency band; a second receiving terminal for outputting a received signal of the second frequency band; a third receiving terminal for outputting a received signal of the third frequency band; a first triplexer, connected to the antenna terminal, for branching transmitting/receiving path connected to the antenna terminal into transmitting/receiving paths of the first, second and third frequency bands; a first switch circuit using a field-effect transistor for switching between a connection of the transmitting/receiving path of the first frequency band with the first transmitting terminal and a connection of the transmitting/receiving path of the first frequency band with the first receiving terminal; a second switch circuit using a field-effect transistor for switching between a connection of the transmitting/receiving path of the second frequency band with the second transmitting terminal and a connection of the transmitting/receiving path of the second frequency band with the second receiving terminal; and a third switch circuit using a field-effect transistor for switching between a connection of the transmitting/receiving path of the third frequency band with the third transmitting terminal and a connection of the transmitting/receiving path of the third frequency band with the third receiving terminal.

With such configuration, the high frequency circuit can be implemented which performs separation of at least three frequency bands and switching between transmission and reception. Since the single triplexer performs the frequency band separation, circuit size growth associated with the separation of at least three or more frequency bands can be prevented, and a small-sized high frequency circuit can be provided at low cost. For example, it is possible to provide a high frequency circuit suitable for use in a front-end module of a communication device which uses WiMAX using frequency bands of 2.5 GHz, 3.5 GHz and 5.8 GHz, or in a front-end module of a communication device which uses both WiMAX and wireless LAN. In the case of the high frequency circuit, particularly, when the triplexer is constructed using an inductance element and capacitance element formed in a laminated substrate, the laminated substrate can be downsized.

In the high frequency circuit, the first triplexer preferably includes a low-pass filter circuit which permits passing of a signal of the first frequency band, a band-pass filter circuit which permits passing of a signal of the second frequency band, and a high-pass filter circuit which permits passing of a signal of the third frequency band. With such configuration, the number of filters constituting the triplexer can be minimized.

Alternatively, in the high frequency circuit, the first triplexer may include a first diplexer for separating a signal of the first and second frequency bands and a signal of the third frequency band, and a second diplexer, connected to the first diplexer, for separating a signal of the first frequency band and a signal of the second frequency band. Since the diplexer is smaller in circuit size than the triplexer, desired characteristics can be achieved more easily.

In the high frequency circuit, the branching function of the triplexer is preferably configured using an inductance element and capacitance element. With such configuration, the structure can be simplified, compared to an SAW filter or the like having a complex structure. Further, the inductance element and capacitance element can be configured using electrode patterns in a laminated substrate, so this configuration is suitable for a case where the high frequency circuit is constructed on a laminated substrate to achieve downsizing.

In the high frequency circuit, it is preferable that a first amplifier circuit is connected to the first transmitting terminal, a second amplifier circuit is connected to the second transmitting terminal, and a third amplifier circuit is connected to the third transmitting terminal. With such configuration, the amplifier circuits, the first to third switch circuits and the triplexer can be designed in an integrated manner, so a matching circuit arranged between the amplifier circuit and the switch circuit, and a matching circuit arranged between the switch circuit and the triplexer can be designed easily.

In the high frequency circuit, it is preferable that a first band-pass filter circuit is arranged on an input-terminal side of the first amplifier circuit, a second band-pass filter is arranged on an input-terminal side of the second amplifier circuit, and a third band-pass filter circuit is arranged on an input-terminal side of the third amplifier circuit. With such configuration, an unwanted noise signal from the input-terminal side can be prevented from entering the amplifier circuit.

In the high frequency circuit, it is preferable that a first low-noise amplifier circuit is arranged between the first switch circuit and the first receiving terminal, a second low-noise amplifier circuit is arranged between the second switch circuit and the second receiving terminal, and a third low-noise amplifier circuit is arranged between the third switch circuit and the third receiving terminal. Further, a first high-pass filter is preferably arranged between the first switch circuit and the first low-noise amplifier circuit. With such configuration, the arrangement of the high-pass filter in the preceding stage of the first low-noise amplifier circuit which amplifies a received signal of the first frequency band can reduce the amplitude of signal of a frequency lower than the first frequency band while preventing an increase in loss of the second and third frequency bands, so distortion by the low-noise amplifier circuit can be reduced.

In the high frequency circuit, it is preferable that a fourth band-pass filter circuit, first low-pass filter circuit and second lowpass filter circuit are arranged on the output-terminal side of the first amplifier circuit, the output-terminal side of the second amplifier circuit, the output-terminal side of the third amplifier circuit and the output-terminal side of the third amplifier circuit, respectively. In combination with the triplexer, such configuration can reduce noise of a frequency lower than a frequency band used and noise of a frequency higher than the frequency band used while suppressing an increase in insertion loss of transmitting path. The fourth band-pass filter may be replaced with a high-pass filter depending on characteristics of the low-pass filter circuit of the triplexer which permits passing of a signal of the first frequency band.

The high frequency circuit may have a configuration in which a first low-noise amplifier circuit is arranged between the first switch circuit and the first receiving terminal, a second low-noise amplifier circuit is arranged between the second switch circuit and the second receiving terminal, a third low-noise amplifier circuit is arranged between the third switch circuit and the third receiving terminal, a first amplifier circuit is connected to the first transmitting terminal, a second amplifier circuit is connected to the second transmitting terminal, a third amplifier circuit is connected to the third transmitting terminal, a first low-pass filter circuit is arranged on the output-terminal side of the second amplifier circuit, a second low-pass filter circuit is arranged on the output-terminal side of the third amplifier circuit, and a fourth band-pass filter circuit or a first high-pass filter circuit is arranged between the first triplexer and the first switch circuit.

Since the high-pass filter is arranged in the preceding stage of the first low-noise amplifier circuit which amplifies a received signal of the first frequency band, the configuration can also reduce the amplitude of signal of a frequency lower than the first frequency band while preventing an increase in loss of the second and third frequency bands, so distortion by the low-noise amplifier circuit can be reduced. Further, in such configuration, the high-pass filter circuit or band-pass filter circuit is arranged between the first triplexer and the first switch circuit, so the number of filters required for the signal path of the first frequency band is reduced, thus contributing to downsizing.

In the high frequency circuit, a detection circuit is preferably arranged between the first triplexer and the antenna terminal. With such configuration, when an output of the detection circuit is fed back, the output power from the amplifier circuit can be regulated. Further, the single detection circuit handles a plurality of frequency bands, so such configuration is suitable for achieving cost reduction and downsizing of the high frequency circuit.

A high frequency circuit may be configured which includes the above high frequency circuit acting as a first sub-high frequency circuit, and further includes a high frequency circuit acting as a second sub-high frequency circuit which includes: an other antenna terminal to be connected to another antenna; a fourth receiving terminal for outputting a received signal of the first frequency band; a fifth receiving terminal for outputting a received signal of the second frequency band; a sixth receiving terminal for outputting a received signal of the third frequency band; and a second triplexer that branches a receiving path connected to the another antenna terminal into receiving paths of the first, second and third frequency bands. With such configuration, a plurality of receiving paths is provided for one frequency band. Thus, the configuration can be used in an SIMO (single-input and multi-output) type high frequency circuit or an MIMO (multi-input and multi-output) type high frequency circuit.

In the high frequency circuit, it is preferable that a fourth low-noise amplifier circuit is arranged between the second triplexer and the another antenna terminal, and a second high-pass filter circuit is arranged between the fourth low-noise amplifier circuit and the another antenna terminal. With such configuration, received signals of a plurality of frequency bands can be amplified by the single low-noise amplifier circuit. Thus the configuration is suitable for achieving cost reduction and downsizing of the high frequency circuit. Further, the arrangement of the high-pass filter in the preceding stage of the fourth low-noise amplifier circuit can reduce the amplitude of signal of a frequency lower than the first frequency band while suppressing an increase in insertion loss, so distortion by the low-noise amplifier circuit can be reduced.

In the high frequency circuit, it is preferable that: a fifth low-noise amplifier circuit and a third high-pass filter circuit disposed between the fifth low-noise amplifier circuit and the second triplexer are arranged in a receiving path of the first frequency band formed between the second triplexer and the fourth receiving terminal; a sixth low-noise amplifier circuit is arranged in a receiving path of the second frequency band formed between the second triplexer and the fifth receiving terminal; and a seventh low-noise amplifier circuit is arranged in a receiving path of the third frequency band formed between the second triplexer and the sixth receiving terminal. With such configuration, in the second sub-high frequency circuit, the arrangement of the high-pass filter in the preceding stage of the fifth low-noise amplifier circuit which amplifies a received signal of the first frequency band, can reduce the amplitude of signal of a frequency lower than the first frequency band while preventing an increase in loss of the second and third frequency bands, so distortion by the low-noise amplifier circuit can be reduced.

In the high frequency circuit, the another antenna terminal and the second triplexer are preferably connected via another switch circuit for switching between connection state and non-connection state. With such configuration, when the another switch circuit is changed to non-connection state, the second triplexer can be isolated from the another antenna terminal.

For the high frequency circuit, a configuration may be used in which there is included an input/output terminal for another communication system other than the communication system using the first, second and third frequency bands, wherein the first switch circuit performs switching between a connection of the antenna terminal with the first transmitting terminal, and a connection of the antenna terminal with the first receiving terminal and a connection of the antenna terminal with the input/output terminal for the another communication system. With such configuration, the switch circuit is provided with the terminal used for branching as well as the transmitting-side terminal and receiving-side terminal of the first frequency band, whereby the input and output function of the another communication system is also performed. In the high frequency circuit, the another communication system is preferably Bluetooth.

The high frequency circuit preferably has a configuration in which a plurality of sub-transmitting terminals are further connected via a rear-stage switch circuit to at least one of the first, second and third transmitting terminals, and a plurality of sub-receiving terminals are further connected via another rear-stage switch circuit to at least one of the first, second and third receiving terminals corresponding to at least one of the first, second and third transmitting terminals, and the rear-stage switch circuit changes connection between at least one of the first, second and third transmitting terminals and the a plurality of sub-transmitting terminals, and the another rear-stage switch circuit changes connection between at least one of the first, second and third receiving terminals and the a plurality of sub-receiving terminals. Such configuration implements a high frequency circuit which can be shared by multiple communication systems using the same frequency bands. That is, switching among the transmitting and receiving circuits can be performed according to the communication system by switching of the rear-stage switch circuit.

In the high frequency circuit, it is preferable that the communication system using the first frequency band is wireless LAN or WiMAX, the communication system using the second frequency band is WiMAX, and the communication system using the third frequency band is wireless LAN or WiMAX.

In the high frequency circuit, it is preferable that at least one of the first triplexer and the second triplexer includes: a first band-pass filter unit, disposed in a first path between a common terminal and a first branching terminal, and permitting passing of a signal of the first frequency band; a second band-pass filter unit, disposed in a second path between the common terminal and a second branching terminal, and permitting passing of a signal of the second frequency band; and a third band-pass filter unit, disposed in a third path between the common terminal and a third branching terminal, and permitting passing of a signal of the third frequency band, and a first, second and third parallel resonant circuits are arranged between the common terminal and the first, second and third band-pass filter units, respectively, and a phase adjustment circuit is arranged between the band-pass filter unit and the parallel resonant circuit in at least two of the first, second and third paths.

The triplexer has two blocking frequency bands while having a passing frequency band. When the parallel resonant circuits are arranged in the paths connected to the common terminal, a signal of another frequency band other than the passing frequency band can be blocked. Further, since the phase adjustment circuit is provided, it is possible to block a signal of another frequency band which the resonant circuit cannot block. With such configuration, a triplexer excellent in branching characteristic can be provided.

In the case of the first and third frequency bands which are on both sides among the frequency bands, or in the case of frequency bands being away from each other, there may be no need to arrange the phase adjustment circuit for one of the paths depending on the impedance and the like of the band-pass filter connected in the rear stage. Consequently, it is preferable that the phase adjustment circuits are arranged in at least two of the paths; in order to achieve more excellent triplexer characteristic, it is more preferable that the phase adjustment circuits are arranged on all the first, second and third paths.

Particularly, in the triplexer, the phase adjustment circuits are preferably arranged in the first and second paths. The third path is a path of the highest frequency band, and may have a phase such that the impedance of the band-pass filter connected in the rear stage is substantially open; thus, satisfactory triplexer characteristic may be achieved without the phase adjustment circuit. Consequently, when the phase adjustment circuits are arranged only in the first and second paths, the triplexer can be downsized.

A high frequency component according to the present invention is one including the above high frequency circuit; and the high frequency circuit is characterized by including an integral laminate comprising pluralities of layers provided with pattern electrodes and elements mounted on a surface of the laminate. Since the high frequency circuit is integrated in the laminated body, the high frequency component can be downsized. The downsizing of the high frequency component contributes to reduction of insertion loss by line resistance.

A communication device according to the present invention is constructed using the inventive high frequency component. The use of the inventive high frequency component contributes downsizing of communication devices, particularly, mobile communication devices and personal computers requiring weight saving and downsizing.

Advantages Of The Invention

According to the present invention, for a high frequency circuit and high frequency component used in a radio device using at least three or more frequency bands, a configuration capable of achieving cost reduction and downsizing can be provided; and cost reduction and downsizing of a communication device using the high frequency circuit and high frequency component can also be achieved.

According to the present invention, for a triplexer for branching a communication signal into signals of three different frequency bands, a configuration capable of achieving excellent triplexer characteristic can be provided; and a high frequency circuit, high frequency component and communication device using the triplexer can also be provided.

BEST MODE FOR CARRYING OUT THE INVENTION

Embodiments of the present invention will be described below with reference to the drawings. The present invention relates to a high frequency circuit used in a communication device that performs radio communication using at least a first frequency band, a second frequency band higher than the first frequency band, and a third frequency band higher than the second frequency band.

As an embodiment of the present invention, a high frequency circuit will be described below which is a front-end module used in a communication device that performs radio communication using at least three frequency bands; as a communication system using the first frequency band, a wireless LAN system of a frequency band of 2.4 GHz or a WiMAX system of a frequency band of 2.5 GHz will be described, and as a communication system using the second frequency band, a WiMAX system of a frequency band of 3.5 GHz will be described, and as a communication system using the third frequency band, a wireless LAN system of a frequency band of 5 GHz or a WiMAX system of a frequency band of 5.8 GHz will be described.

The following descriptions will be given assuming that the first frequency band is 2.5 GHz, the second frequency band higher than the first frequency band is 3.5 GHz, and the third frequency band higher than the second frequency band is 5.8 GHz.

Figure 1:
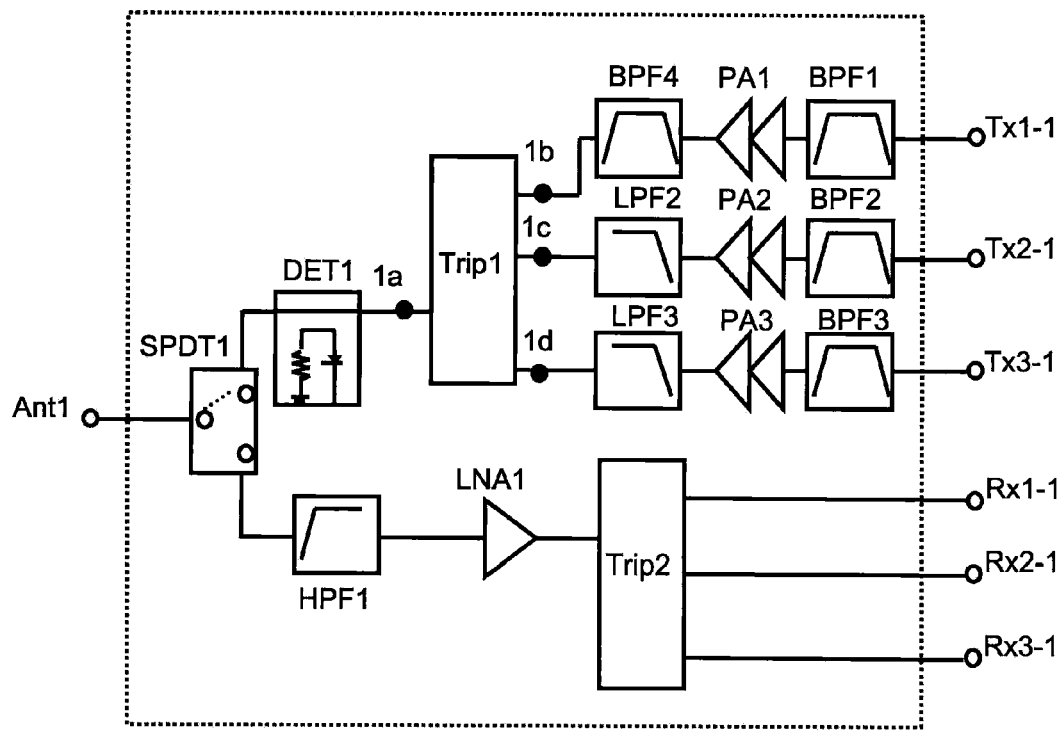
FIG. 1 is a circuit block diagram of a first embodiment of a high frequency circuit according to the present invention.

(First Embodiment of High Frequency Circuit):

FIG. 1 is a circuit block diagram of a first embodiment of the high frequency circuit. The high frequency circuit having the circuit block illustrated in FIG. 1 includes an antenna terminal Ant1 to be connected to a multi-band antenna, a first transmitting terminal Tx1-1 for inputting a transmit signal of the first frequency band of 2.5 GHz, a second transmitting terminal Tx2-1 for inputting a transmit signal of the second frequency band of 3.5 GHz, and a third transmitting terminal Tx3-1 for inputting a transmit signal of the third frequency band of 5.8 GHz.

The high frequency circuit further includes a first receiving terminal Rx1-1 for outputting a received signal of the first frequency band of 2.5 GHz, a second receiving terminal Rx2-1 for outputting a received signal of the second frequency band of 3.5 GHz, and a third receiving terminal Rx3-1 for outputting a received signal of the third frequency band of 5.8 GHz.

A common terminal of a single pole double throw switch circuit SPDT1 is connected to the antenna terminal Ant1; and a transmitting-side triplexer Trip1 is connected via a detection circuit DET1 to a transmitting-side terminal of the switch circuit SPDT1. A first receiving-side triplexer Trip2 is connected to a receiving-side terminal of the switch circuit SPDT1. The switch circuit SPDT1 is used for switching between a connection of the antenna terminal with the first, second and third transmitting terminals and a connection of the antenna terminal with the first, second and third receiving terminals. Preferably, the high frequency circuit further includes the following configuration.

Referring to the configuration of FIG. 1, a first low-noise amplifier circuit LNA1 is arranged in the receiving path between the switch circuit SPDT1 and first receiving-side triplexer Trip2. Further, a high-pass filter circuit HPF1 is arranged between the first low-noise amplifier circuit LNA1 and switch circuit SPDT1.

A first amplifier circuit PA1 is connected in a transmitting path of the first frequency band between the transmitting-side triplexer Trip1 and first transmitting terminal Tx1-1; and a first band-pass filter circuit BPF1 is connected to an input-side terminal of the first amplifier circuit PA1, and a fourth band-pass filter circuit BPF4 is connected to an output side terminal of the first amplifier circuit PA1.

A second amplifier circuit PA2 is connected in a transmitting path of the second frequency band between the transmitting-side triplexer Trip1 and second transmitting terminal Tx2-1; and a second band-pass filter circuit BPF2 is connected to an input-side terminal of the second amplifier circuit PA2, and a first low-pass filter circuit LPF2 is connected to an output side terminal of the second amplifier circuit PA2.

A third amplifier circuit PA3 is connected in a transmitting path of the third frequency band between the transmitting-side triplexer Trip1 and third transmitting terminal Tx3-1; and a third band-pass filter circuit BPF3 is connected to an input side terminal of the third amplifier circuit PA3, and a second low-pass filter circuit LPF3 is connected to an output side terminal of the third amplifier circuit PA3.

The first receiving terminal Rx1-1, second receiving terminal Rx2-1 and third receiving terminal Rx3-1 are connected to the first receiving-side triplexer Trip2, constituting respective receiving paths of the first frequency band, second frequency band and third frequency band.

That is, the transmitting-side triplexer Trip1 and the first receiving-side triplexer Trip2 branch the transmitting and receiving paths connected to the antenna terminal Ant1 into transmitting and receiving paths of the first, second and third frequency bands. In the example of FIG. 1, the transmitting-side triplexer Trip1 is used for branching of transmitting path, and the first receiving-side triplexer Trip2 is used for branching of receiving path.

Referring to the configuration of FIG. 1, the switch circuit SPDT1 performs switching between a connection of the antenna terminal Ant1 with the transmitting-side triplexer Trip1 and a connection of the antenna terminal Ant1 with the first receiving-side triplexer Trip2. As described above, the first transmitting terminal Tx1-1, second transmitting terminal Tx2-1 and third transmitting terminal Tx3-1 are connected to the transmitting-side triplexer Trip1, and the first receiving terminal Rx1-1, second receiving terminal Rx2-1 and third receiving terminal Rx3-1 are connected to the first receiving-side triplexer Trip2. Consequently, the switch circuit SPDT1 can performs switching between a connection of the antenna terminal Ant1 with the first, second and third transmitting terminals and a connection of the antenna terminal Ant1 with the first, second and third receiving terminals.

In the example illustrated in FIG. 1, a single pole double throw switch circuit (SPDT) using a field-effect transistor is used as the switch circuit. The switch circuit using a field-effect transistor can be formed as an IC to downsize the circuit. In constructing the high frequency circuit according to the present invention with a laminated module using a ceramic laminated substrate or the like, particularly when the number of triplexers occupying a large space is large, the switch circuit is formed as an IC and mounted on the laminated body, whereby the whole structure can be downsized.

In the high frequency circuit illustrated in FIG. 1, the first, second and third band-pass filter circuits (BPF1 to 3), connected between the first to third amplifier circuits (PA1 to PA3) and the first to third transmitting terminals, eliminate unwanted out-of-band noise contained in a transmit signal inputted from the transmitting terminal. And the fourth band-pass filter circuit, second low-pass filter circuit LPF2 and third low-pass filter circuit LPF3, connected between the first to third amplifier circuits (PA1 to PA3) and the transmitting-side triplexer Trip1, attenuate harmonic signals produced by the amplifier circuits.

In order to prevent interference to the mobile phone system, a signal of the receiving frequency band of the mobile phone system which is produced by the amplifier circuits must be suppressed. Particularly, when the first frequency band being a lower frequency band is a band of 2.5 GHz of WiMAX, since the receiving frequency of WCDMA (Wide Band CDMA) mobile terminal is 2.11 to 2.17 GHz which is close to the WiMAX band, the band-pass filter circuit is used, whereby a signal of the frequency lower than the first frequency band can be attenuated efficiently. In the path of the second frequency band and the path of the third frequency band, the filters constituting the transmitting-side triplexer can attenuate a signal of a frequency lower than the respective frequency bands. In a case of application in which there is less influence on a mobile phone system, a low-pass filter circuit may be used instead of the fourth band-pass filter circuit BPF4.

The first low-noise amplifier circuit LNA1, connected between the switch circuit SPDT1 and first receiving-side triplexer Trip2, amplifies a received signal which is inputted to the first receiving-side triplexer Trip2. The first low-noise amplifier circuit LNA1 of FIG. 1 is configured to amplify received signals of three frequency bands in one low-noise amplifier circuit, so the number of low-noise amplifier circuits used is small, contributing to downsizing of the high frequency circuit.

The first high-pass filter circuit HPF1, arranged between the first low-noise amplifier circuit LNA1 and switch circuit SPDT1, can prevent saturation of the low-noise amplifier circuit caused by interfering wave of a frequency lower than the first frequency band produced by a mobile device such as mobile phone. In the case of WiMAX which uses a band of 2.5 GHz as the first frequency band, the filter characteristic is adjusted to attenuate a signal of a frequency lower than 2.5 GHz. A band-pass filter circuit may be used instead of the high-pass filter circuit, but the high-pass filter circuit is smaller in insertion loss than the band-pass filter circuit; thus the high-pass filter circuit is preferably used to improve receiving sensitivity, compared with the band-pass filter circuit.

With the above configuration, a received signal of WiMAX received via the antenna goes through the antenna terminal Ant1 and the switch circuit SPDT1, and is amplified by the first low-noise amplifier circuit LNA1 and branched by the first receiving-side triplexer Trip2 and outputted to the first receiving terminal Rx1-1, second receiving terminal Rx2-1 or third receiving terminal Rx3-1. A transmit signal inputted to the first transmitting terminal Tx1-1, second transmitting terminal Tx2-1 or third transmitting terminal Tx3-1 is amplified by the amplifier circuit, and thereafter goes through the transmitting-side triplexer Trip1, switch circuit SPDT1 and antenna terminal Ant1, and is transmitted via the antenna.

In this case, the transmit signal amplified by the amplifier circuit may be distorted in the switch circuit SPDT1, so that the switch circuit SPDT1 produces harmonic wave. In order to address this problem, a frequency variable filter for which the passing frequency band and blocking frequency band are variable is arranged between the switch circuit SPDT1 and antenna terminal Ant1. For example, the frequency variable filter can be constructed by combining a variable-capacitance diode for which the characteristic varies according to voltage, and a passive element such as inductance element, capacitance element and resistance element. As the voltage variable element, PIN diode, field-effect transistor, MEMS switch or the like can also be used.

Referring to the configuration of FIG. 1, the detection circuit DET1 is arranged in the transmitting path between the transmitting-side triplexer Trip1 and antenna terminal Ant1. As the detection circuit DET1, for example, a configuration is used which includes a coupler circuit constituted of a main line and sub-line coupled, wherein one end of the sub-line is connected via a resistor to the ground, and the other end thereof is connected to a transmission line for matching, and connected via a resistor to a schottky diode and a voltage smoothing circuit constituted of a resistance element and capacitance element, and connected to a detection output terminal.

DC voltage dependent on the output power of the amplifier circuit PA1, PA2 or PA3 is outputted via the detection output terminal. The detection circuit may be arranged on the output side of each amplifier circuit, but in order to suppress an increase in the number of detection circuits, the detection circuit is preferably arranged in the path between the transmitting-side triplexer Trip1 and antenna terminal Ant1. Referring to FIG. 1, the detection circuit DET1 is arranged between the transmitting-side triplexer Trip1 and switch circuit SPDT1. The detection circuit may be integrated in the amplifier circuit; in this case, there is no need to arrange the detection circuit at the position illustrated in FIG. 1.

Figure 2:
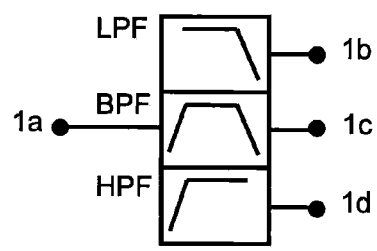
FIG. 2 is a view illustrating an exemplary configuration of a triplexer.

(Triplexer):

The triplexer is configured as illustrated in the block diagram of FIG. 2, for example. The triplexer illustrated in FIG. 2 is constructed using a low-pass filter circuit (LPF) which permits passing of a signal of the first frequency band, a band-pass filter circuit (BPF) which permits passing of a signal of the second frequency band, and a high-pass filter circuit (HPF) which permits passing of a signal of the third frequency band. With the configuration illustrated in FIG. 2, the number of filters constituting the triplexer can be minimized, which is advantageous in downsizing.

Figure 3:
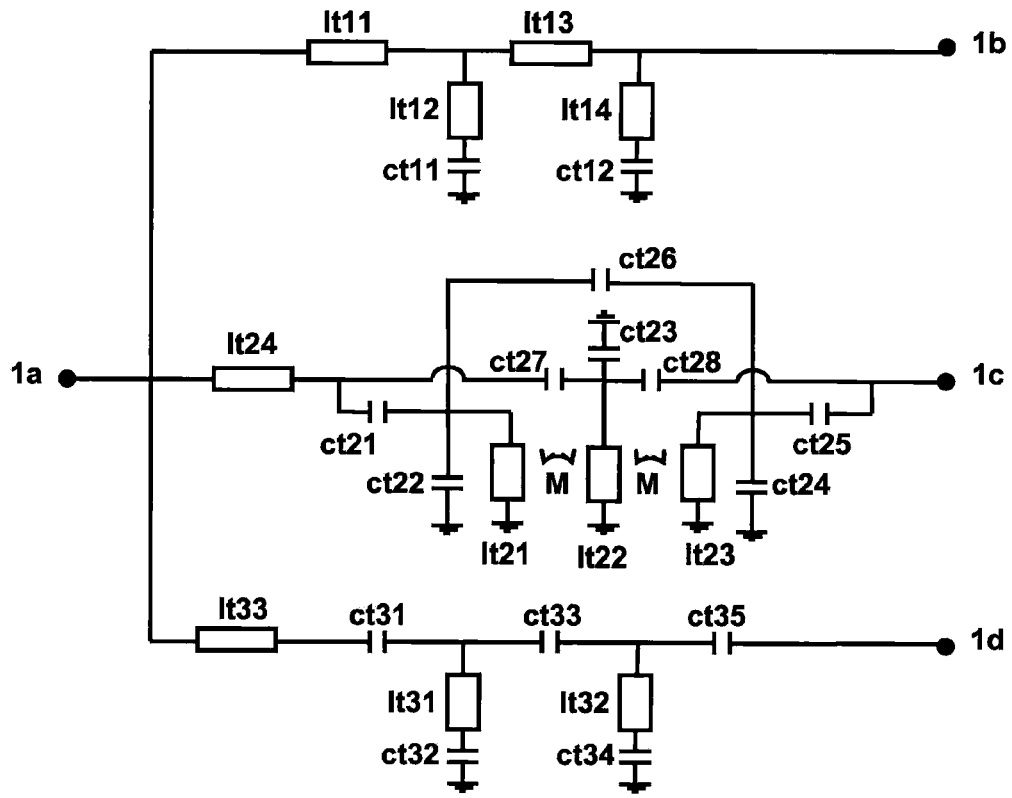
FIG. 3 is an equivalent circuit diagram of the exemplary triplexer used in the high frequency circuit according to the present invention.

FIG. 3 is a view for describing an example of equivalent circuit of the triplexer. The low-pass filter circuit, band-pass filter circuit and high-pass filter circuit constituting the triplexer are each constituted of an LC circuit using an inductance element, such as transmission line, and capacitance element. That is, the triplexer function is performed by the inductance element and capacitance element.

The low-pass filter circuit permitting passing of a signal of the first frequency band includes: a transmission line lt13, a series resonant circuit constituted of lt12 and ct11, having a resonant frequency of about 5.8 GHz which is the third frequency band, and connected between one end of lt13 and the ground; a series resonant circuit constituted of lt14 and ct14, having a resonant frequency of about 3.5 GHz which is the second frequency band, and connected between another end of lt13 and the ground; and a transmission line lt11 for phase adjustment.

The band-pass filter circuit permitting passing of a signal of the second frequency band is basically constituted of three transmission lines lt21, lt22 and lt23, each having one end connected to the ground, magnetically coupled to each other. A parallel resonant circuit of lt21 and ct22, parallel resonant circuit of lt22 and ct23, and parallel resonant circuit of lt23 and ct24 have a resonant frequency set to about 3.5 GHz which is the second frequency band.

ct21 denotes an input capacitor; ct26, ct27 and ct28 denote a coupling supplementary capacitor for adjusting the degree of coupling between the transmission lines lt21, lt22 and lt23; ct25 denotes an output capacitor; lt24 denotes a transmission line for phase adjustment. The attenuation pole frequency is preferably set to about 2.5 GHz being the first frequency band and about 5.8 GHz being the third frequency band.

The high-pass filter circuit permitting passing of a signal of the third frequency band includes: capacitors ct31, ct33 and ct35 connected in series in the path; a series resonant circuit constituted of lt31 and ct32 having a resonant frequency of about 3.5 GHz which is the second frequency band, and connected between the connection point between ct31 and ct33 and the ground; a series resonant circuit constituted of lt32 and ct34 having a resonant frequency of about 2.5 GHz which is the first frequency band, and connected between the connection point between ct33 and ct35 and the ground; and a transmission line lt33 for phase adjustment.

These elements can be constructed using an electrode pattern in a laminated substrate, and thus has great design flexibility. Consequently, the triplexer constituted of these elements has a configuration suitable for a case where the high frequency circuit is constructed on a laminated substrate to achieve downsizing. The passing frequency bands of each filter circuit are adjusted according to the frequency bands used. In the case of WiMAX, the passing frequency bands of each filter circuit are adjusted to 2.5 GHz, 3.5 GHz and 5.8 GHz, respectively.

Figure 4:
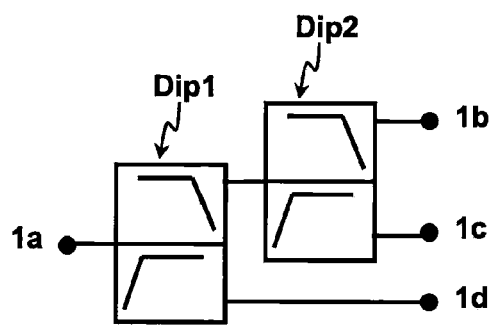
FIG. 4 is a view illustrating another exemplary configuration of the triplexer.

Further, the triplexer may have a configuration represented by the block diagram illustrated in FIG. 4. The triplexer illustrated in FIG. 4 includes a first diplexer (Dip1) that separates signals of the first and second frequency bands from a signal of the third frequency band, and a second diplexer (Dip2), connected to the first diplexer, separating a signal of the first frequency band from a signal of the second frequency band.

The triplexer illustrated in FIG. 4 is also constructed using an inductance element and capacitance element. In the configuration of the triplexer illustrated in FIG. 4, the diplexer is smaller in circuit size than the triplexer, so it is easier to achieve desired characteristics. The above described circuit configuration, such as switch circuit, triplexer, band-pass filter circuit, low-pass filter circuit and low-noise amplifier circuit, can be similarly used for the following embodiments.

Figure 5:
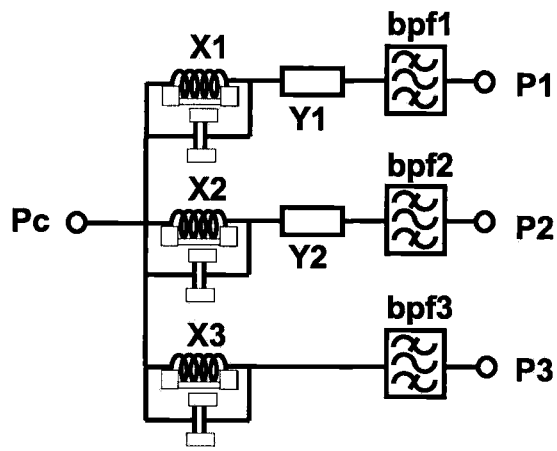
FIG. 5 is a circuit block diagram illustrating an embodiment of the triplexer.

Further, the triplexer may have a configuration represented by the block diagram illustrated in FIG. 5. A first band-pass filter unit bpf1 permitting passing of a signal of the first frequency band (2.5 GHz band) is arranged in a first path between a common terminal Pc and a first branching terminal P1; a second band-pass filter unit bpf2 permitting passing of a signal of the second frequency band (3.5 GHz band) higher than the first frequency band is arranged in a second path between the common terminal Pc and a second branching terminal P2; and a third band-pass filter unit bpf3 permitting passing of a signal of the third frequency band (5.8 GHz band) higher than the second frequency band is arranged in a third path between the common terminal Pc and a third branching terminal P3, whereby the triplexer is constructed.

Figure 6:
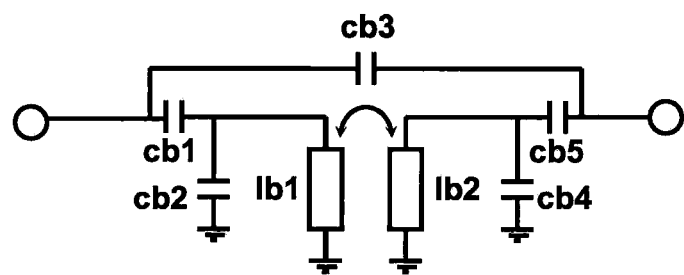
FIG. 6 is a view illustrating an exemplary equivalent circuit of a band-pass filter unit using the triplexer.

The configuration of the first to third band-pass filter units is not particularly limited, but a configuration illustrated in FIG. 6 may be used, for example. The band-pass filter illustrated in FIG. 6 includes two resonant lines lb1 and lb2 coupled to each other, and capacitors cb1 to cb5. The degree of coupling between the resonant lines lb1 and lb2, the length and thickness of lb1 and lb2, and the capacitance value of the capacitors cb1 to cb5 are adequately adjusted to form a band-pass filter which has the passing frequency band and the blocking frequency band of desired frequencies.

Frequency bands used by other systems are close to the first to third frequency bands; for example, mobile phones use frequency bands lower than the frequency band of 2.4 to 2.5 GHz used by WiMAX and wireless LAN. Accordingly, in order to block signals of frequency bands other than the first to third frequency bands, band-pass filters are preferably used for each filter unit constituting the main part of the triplexer.

The resonant frequencies of parallel resonant circuits (X1 to X3) are preferably set to the two blocking bands other than the passing band, and the resonant frequency is more preferably set to the lower of the two blocking bands. Accordingly, the frequency band to be adjusted by the phase adjustment circuit is in the higher frequency side; thus, assuming that the phase angle to be adjusted is identical, the physical configuration of the phase adjustment circuit can be downsized accordingly. As a result, the configuration of the whole circuit may be downsized.

In the configuration illustrated in FIG. 5, in order to improve the triplexer characteristic, the first, second and third parallel resonant circuits (X1 to X3) are arranged, respectively, between the first, second and third band-pass filter units (bpf1 to bpf3) and the common terminal Pc. Further, in the first and second paths among the first, second and third paths, a transmission line is arranged as the phase adjustment circuit (Y1, Y2) between the band-pass filter unit and the parallel resonant circuit. As the first, second and third parallel resonant circuits (X1 to X3), parallel resonant circuits constituted of an inductance element L and capacitance element C are used.

As the inductance element L, a chip inductor may be used, or a transmission line may be used. As the phase adjustment circuit, any circuit capable of phase adjustment can be used; apart from a transmission line, a high-pass filter, low-pass filter, matching circuit or the like can be used. In order to reduce insertion loss, a transmission line is preferably used.

The resonant frequency of the parallel resonant circuit X1 arranged between the first band-pass filter unit bpf1 and common terminal Pc is set to 3.5 GHz band being the second frequency band to block passing of a signal of 3.5 GHz band. Further, phase adjustment is made by the phase adjustment circuit Y1 arranged between the first band-pass filter unit bpf1 and first parallel resonant circuit X1, so that the impedance as seen from the common terminal Pc is in an open state at 5.8 GHz band being the third frequency band.

Here, it is desirable that the adjustment be made by the phase adjustment circuit Y1 so that the impedance is substantially in an open state at 5.8 GHz band, but when the adjustment is made so that the phase of impedance as seen from the common terminal Pc is in a range of 0°±60° at 5.8 GHz band being the third frequency band, the loss degradation at the passing band is within the allowable range. With such configuration, signals of 3.5 GHz and 5.8 GHz being the two frequency bands other than the passing frequency band can be satisfactorily blocked.

The resonant frequency of the parallel resonant circuit X2 arranged between the second band-pass filter unit bpf2 and common terminal Pc is set to 2.5 GHz band being the first frequency band to block passing of a signal of 2.5 GHz band. Further, phase adjustment is made by the phase adjustment circuit Y2 arranged between the second band-pass filter unit bpf2 and second parallel resonant circuit X2, so that the impedance as seen from the common terminal Pc is in an open state at 5.8 GHz band being the third frequency band.

Here, it is desirable that the adjustment be made by the phase adjustment circuit Y2 so that the impedance is substantially in an open state at 5.8 GHz band, but when the adjustment is made so that the impedance as seen from the common terminal Pc has a phase of 0°±60° at 5.8 GHz band being the third frequency band, the loss degradation at the passing band is within the allowable range. With such configuration, signals of 2.5 GHz and 5.8 GHz being the two frequency bands other than the passing frequency band can be satisfactorily blocked.

The resonant frequency of the parallel resonant circuit X3 arranged between the third band-pass filter unit bpf3 and common terminal Pc is set to 2.5 GHz band being the first frequency band to block passing of a signal of 2.5 GHz band.

In the configuration of FIG. 5, no phase adjustment circuit is arranged in the path related to the third frequency band being the highest frequency band, i.e., between the third band-pass filter unit bpf3 and the third parallel resonant circuit X3. The reason for this is that the impedance of the band-pass filter connected in the rear stage has an impedance close to an open state, so satisfactory triplexer characteristics can be achieved without arranging a phase adjustment circuit. With such configuration, signals of 2.5 GHz and 3.5 GHz being the two frequency bands other than the passing frequency band can be satisfactorily blocked.

According to the present embodiment, in permitting passing of a signal of 2.5 GHz, the frequency band blocked by the parallel resonant circuit is set to 3.5 GHz and the frequency band blocked by the phase adjustment circuit is set to 5.8 GHz. However, the frequency band blocked by the parallel resonant circuit may be set to 5.8 GHz and the frequency band blocked by the phase adjustment circuit may be set to 3.5 GHz. That is, the frequency band blocked by the parallel resonant circuit may be replaced with the frequency band blocked by the phase adjustment circuit.

Figure 7:
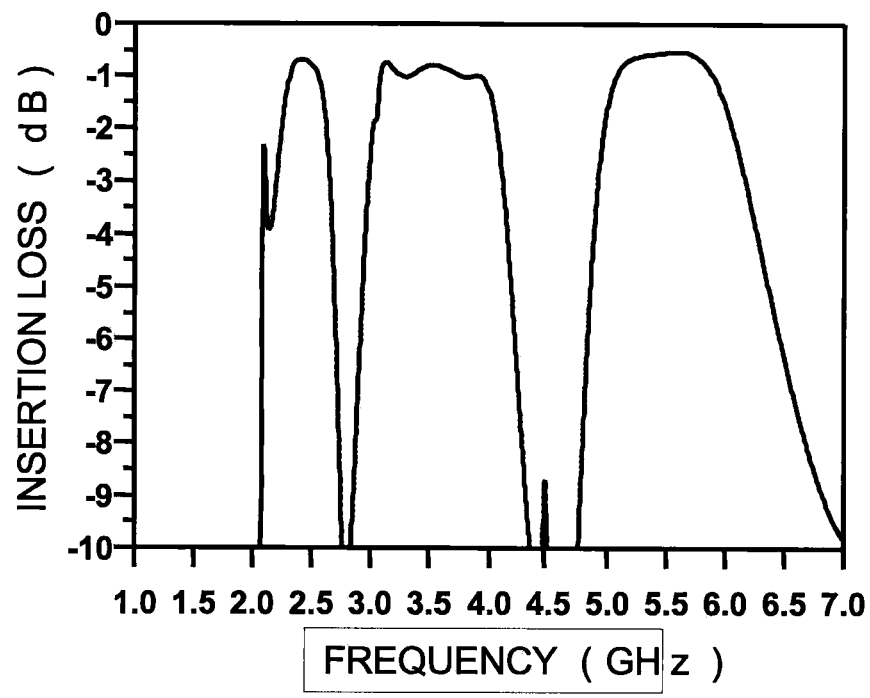
FIG. 7 is a view illustrating filter characteristics for each frequency band of the triplexer having the configuration illustrated in FIG. 5.
Figure 8:
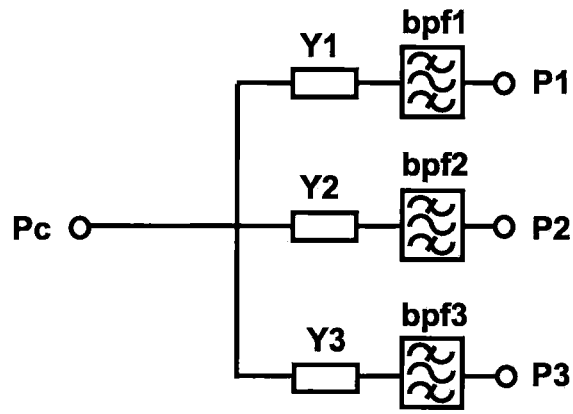
FIG. 8 is a circuit block diagram illustrating a related art triplexer.
Figure 9:
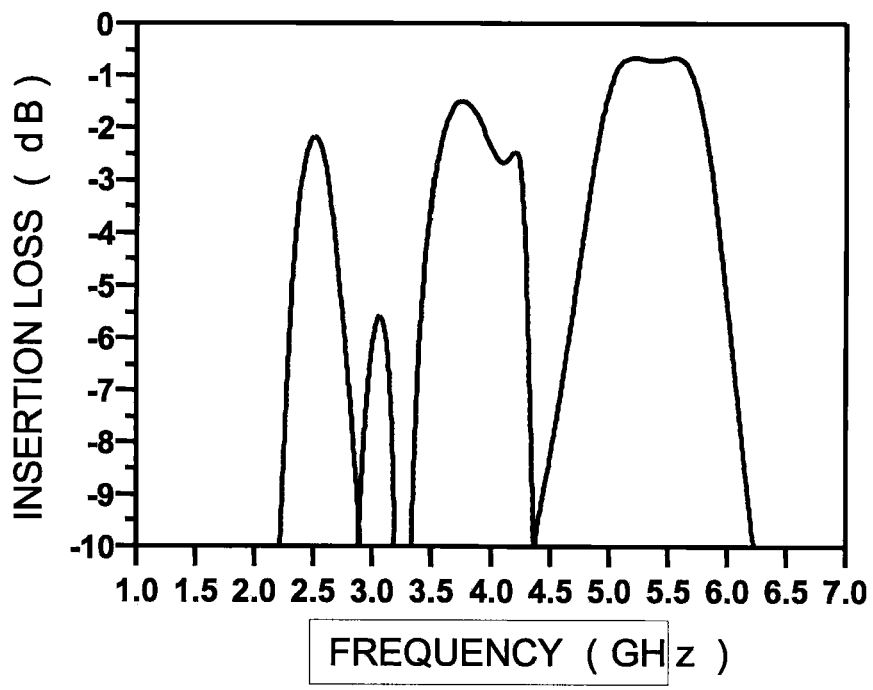
FIG. 9 is a view illustrating filter characteristics for each frequency band of the related art triplexer.

FIG. 7 illustrates filter characteristics for each frequency band of the triplexer having the configuration illustrated in FIG. 5. For comparison, the filter characteristics of a triplexer constituted of a circuit block illustrated in FIG. 8 is illustrated in FIG. 9. The triplexer illustrated in FIG. 8 is a related art triplexer in which only transmission lines (Y1 to Y3) for phase adjustment are arranged between the common terminal Pc and each of the band-pass filter units.

In the related art triplexer, a peak indicating attenuation degradation exists between the 2.5 GHz band and the 3.5 GHz band and further the slope at both sides of the passing band is more gradual. Also, insertion loss at the passing band is larger. In contrast, in the characteristics of the triplexer according to the embodiment illustrated in FIG. 5, as illustrated in FIG. 7, no attenuation degradation exists between the 2.5 GHz band and the 3.5 GHz band and precipitous filter characteristics are also provided. Further, insertion loss for each passing band is smaller and the passing band is wider. Consequently, it can be seen that a significantly excellent triplexer is provided compared to the related art triplexer.

As described above, the configuration according to the embodiment illustrated in FIG. 5 has two types of means, the parallel resonant circuit and phase adjustment circuit, used to block two frequency bands other than the passing frequency band, and is thus suitable for the triplexer used for separation of three different frequency bands. The resonant frequency of the parallel resonant circuit of each path is set to one of the frequency bands other than the passing frequency band and also phase adjustment is made by the phase adjustment circuit arranged in the path so that the impedance as seen from the common terminal Pc is in an open state at one of the frequency bands other than the passing frequency band; thus an excellent triplexer is provided.

According to the embodiment illustrated in FIG. 5, the interval between the second frequency band (3.5 GHz band) and the third frequency band (5.8 GHz band) is greater than the interval between the first frequency band (2.5 GHz band) and the second frequency band (3.5 GHz band). In this way, when one of the frequency bands used is distant from the other frequency bands, provision of the phase adjustment circuit may be omitted in one of the paths of the frequency bands used.

In the case of WiMAX or a combination of WiMAX and wireless LAN using frequency bands having a frequency interval of 2 GHz or more therebetween, the center frequencies of each frequency band are 1 GHz or more away from each other, but the total width of the frequency bands used for the communication system is smaller than 4 GHz, and the center frequency of the third frequency band is smaller than three times the center frequency of the first frequency band. The triplexer according to the present embodiment is suitable for such case in which the range from the first frequency band to the third frequency band is narrow.

Figure 10:
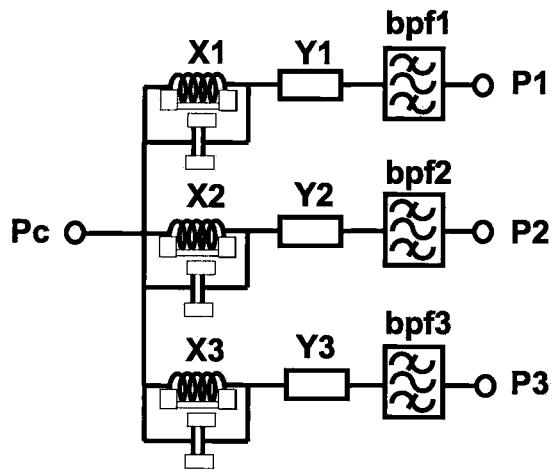
FIG. 10 is a circuit block diagram illustrating another embodiment of the triplexer.

FIG. 10 is a circuit block diagram illustrating another embodiment of the triplexer. In the configuration illustrated in FIG. 10, added to the configuration illustrated in FIG. 5 is a transmission line provided as a phase adjustment circuit Y3 between the third band-pass filter unit bpf3 and third parallel resonant circuit X3 in the path of 5.8 GHz band. In other aspects, the configuration is similar to that of the embodiment illustrated in FIG. 5 and hence an explanation thereof is omitted. Phase adjustment is made by the phase adjustment circuit Y3 so that the impedance as seen from the common terminal Pc is in an open state at 3.5 GHz band being the second frequency band. With such configuration, the triplexer characteristics can be further improved.

Figure 11:
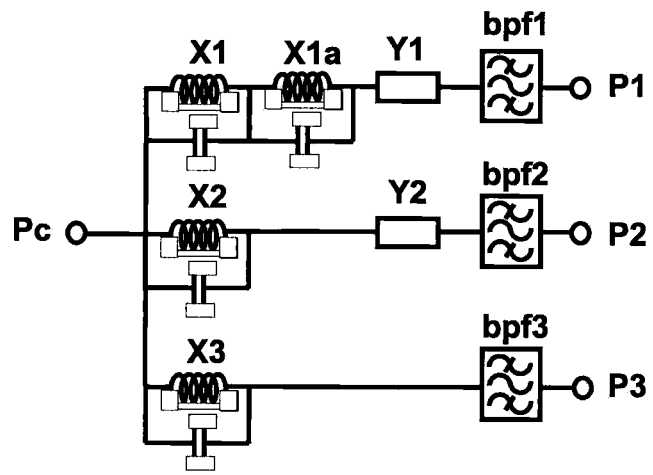
FIG. 11 is a circuit block diagram illustrating another embodiment of the triplexer.

FIG. 11 is a circuit block diagram illustrating another embodiment of the triplexer. In the configuration illustrated in FIG. 11, added to the configuration illustrated in FIG. 5 is a parallel resonant circuit X1a between the first parallel resonant circuit X1 and first band-pass filter in the path of 2.4 GHz band. In other aspects, the configuration is similar to that of the embodiment illustrated in FIG. 5 and hence an explanation thereof is omitted. The resonant frequencies of the parallel resonant circuits X1 and X1a are set to substantially the same frequency, or set slightly different from each other, whereby attenuating characteristics (triplexer characteristics) in the blocking frequency band can be improved or the blocking frequency band can be widened.

Figure 12:
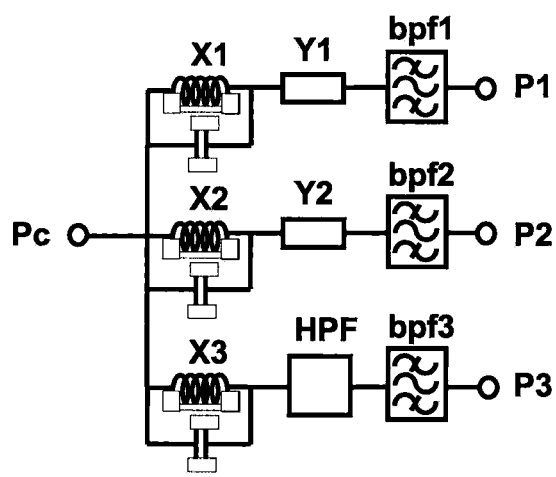
FIG. 12 is a circuit block diagram illustrating another embodiment of the triplexer.

FIG. 12 is a circuit block diagram illustrating another embodiment of the triplexer. In the configuration illustrated in FIG. 12, added to the configuration illustrated in FIG. 5 is a high-pass filter HPF provided as a phase adjustment circuit between the third band-pass filter unit bpf3 and third parallel resonant circuit X3 in the path of 5.8 GHz band. As the high-pass filter, one having an equivalent circuit illustrated in FIG. 13 is used.

Figure 13:
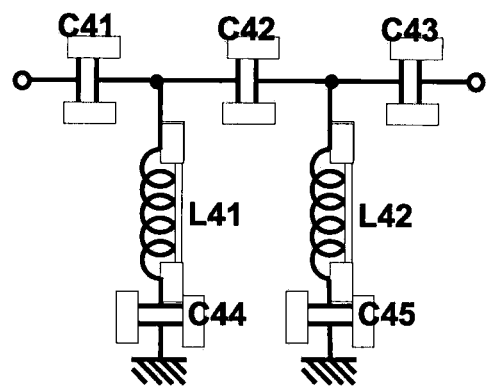
FIG. 13 is an equivalent circuit diagram illustrating an exemplary high-pass filter.

The high-pass filter illustrated in FIG. 13 includes: capacitors C41, C42 and C43 connected between the input- and output-terminals; a series resonant circuit constituted of an inductance element L41 and capacitor C44; and a series resonant circuit constituted of an inductance element L42 and capacitor C45. However, the configuration of the high-pass filter is not limited to one illustrated in FIG. 13. In other aspects, the configuration is similar to that of the embodiment illustrated in FIG. 5 and hence an explanation thereof is omitted. Phase adjustment is made by the high-pass filter HPF so that the impedance as seen from the common terminal Pc is substantially in an open state at 3.5 GHz band being the second frequency band. With such configuration, the triplexer characteristics can be further improved.

Figure 14:
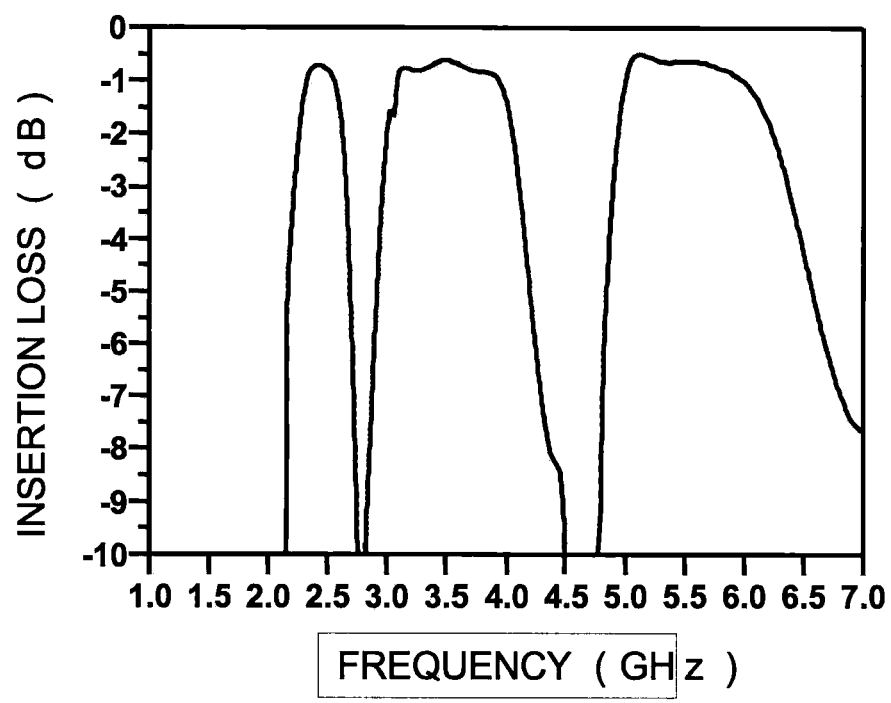
FIG. 14 is a view illustrating filter characteristics for each frequency band of the triplexer having the configuration illustrated in FIG. 12.

FIG. 14 illustrates filter characteristics for each frequency band of the triplexer having the configuration illustrated in FIG. 12. As evident from the result illustrated in FIG. 14, the triplexer illustrated in FIG. 12 achieves more excellent triplexer characteristics than the related art triplexer illustrated in FIG. 8. Further, a ripple observed at 2.1 GHz in the filter characteristics of FIG. 7 is reduced, so the filter characteristics are improved.

The above described triplexer may be constructed as a single component or may be, as described below, used as part of the high frequency circuit to constitute a high frequency component.

(Second Embodiment of High Frequency Circuit)

Figure 15:
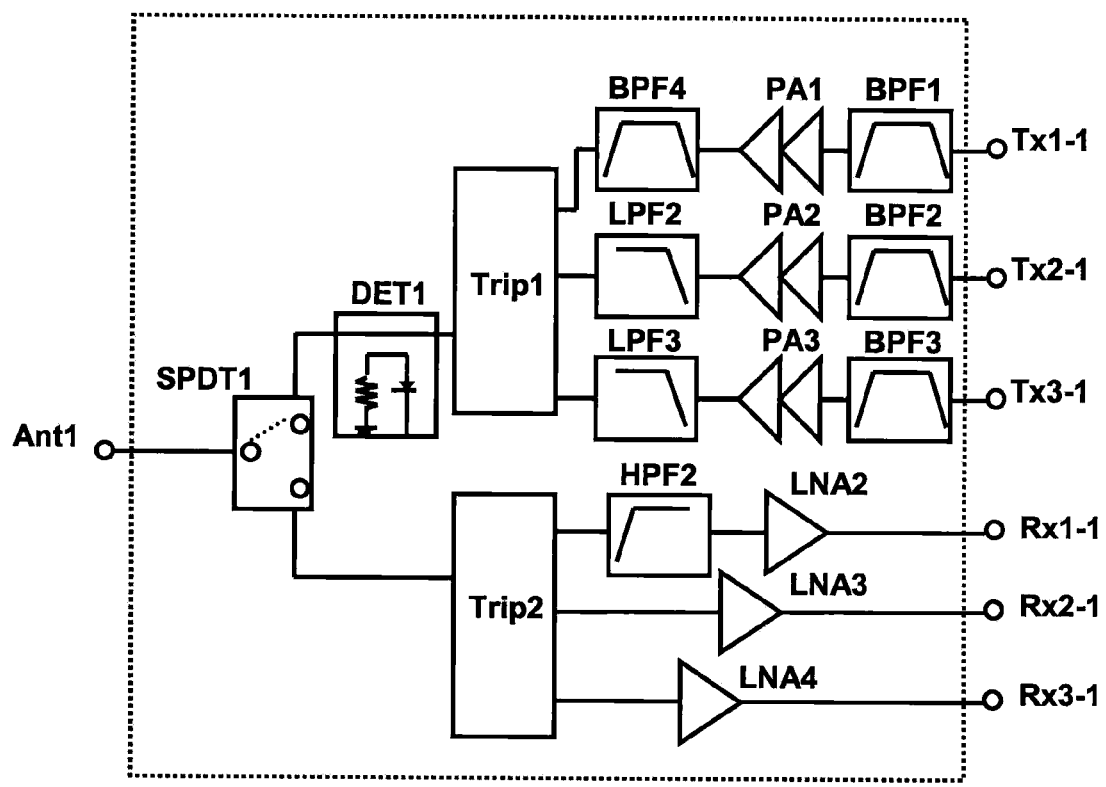
FIG. 15 is a circuit block diagram of a second embodiment of the high frequency circuit according to the present invention.

Another embodiment of the present invention will be described with reference to FIG. 15. The high frequency circuit illustrated in FIG. 15 is obtained by modifying the receiving-side configuration of the high frequency circuit illustrated in FIG. 1. The part extending from the antenna terminal Ant1 via the switch circuit SPDT1 to the first transmitting terminal Tx1-1, the second transmitting terminal Tx2-1 and the third transmitting terminal Tx3-1 is similar to the configuration of FIG. 1 and hence an explanation thereof is omitted.

The receiving-side configuration of the high frequency circuit illustrated in FIG. 15 is as follows: In a receiving path of the first frequency band formed between a first receiving-side triplexer Trip2 and first receiving terminal Rx1-1, there are arranged a second low-noise amplifier circuit LNA2 and a second high-pass filter circuit HPF2 disposed between the second low-noise amplifier circuit LNA2 and first receiving-side triplexer Trip2. In a receiving path of the second frequency band formed between the first receiving-side triplexer Trip2 and second receiving terminal Rx2-1, there is arranged a third low-noise amplifier circuit LNA3. Further, in a receiving path of the third frequency band formed between the first receiving-side triplexer Trip2 and a third receiving terminal Rx3-1, there is arranged a fourth low-noise amplifier circuit LNA4.

The second high-pass filter circuit HPF2 is adjusted to permit passing of a signal of the first frequency band (2.5 GHz of WiMAX), allowing attenuation of interfering wave of a frequency lower than the first frequency band produced by a mobile device such as mobile phone, so that the saturation of the low-noise amplifier circuit caused by the interfering wave is prevented. When it is desired to attenuate sharply a signal of a frequency lower than the first frequency band, the second high-pass filter may be replaced with a band-pass filter.

In the configuration of FIG. 15, the first receiving-side triplexer capable of attenuating a signal of a frequency lower than the second frequency band is connected to the input side of the third low-noise amplifier circuit LNA3. Thus, there is no need to arrange a filter circuit corresponding to the second high-pass filter circuit HPF2, and thus signal loss in the path of the second frequency band can be suppressed. Also, the first receiving-side triplexer capable of attenuating a signal of a frequency lower than the third frequency band is connected to the input side of the fourth low-noise amplifier circuit LNA4. Thus, there is no need to arrange a filter circuit corresponding to the second high-pass filter circuit HPF2, and thus signal loss in the path of the third frequency band can be suppressed.

Figure 16:
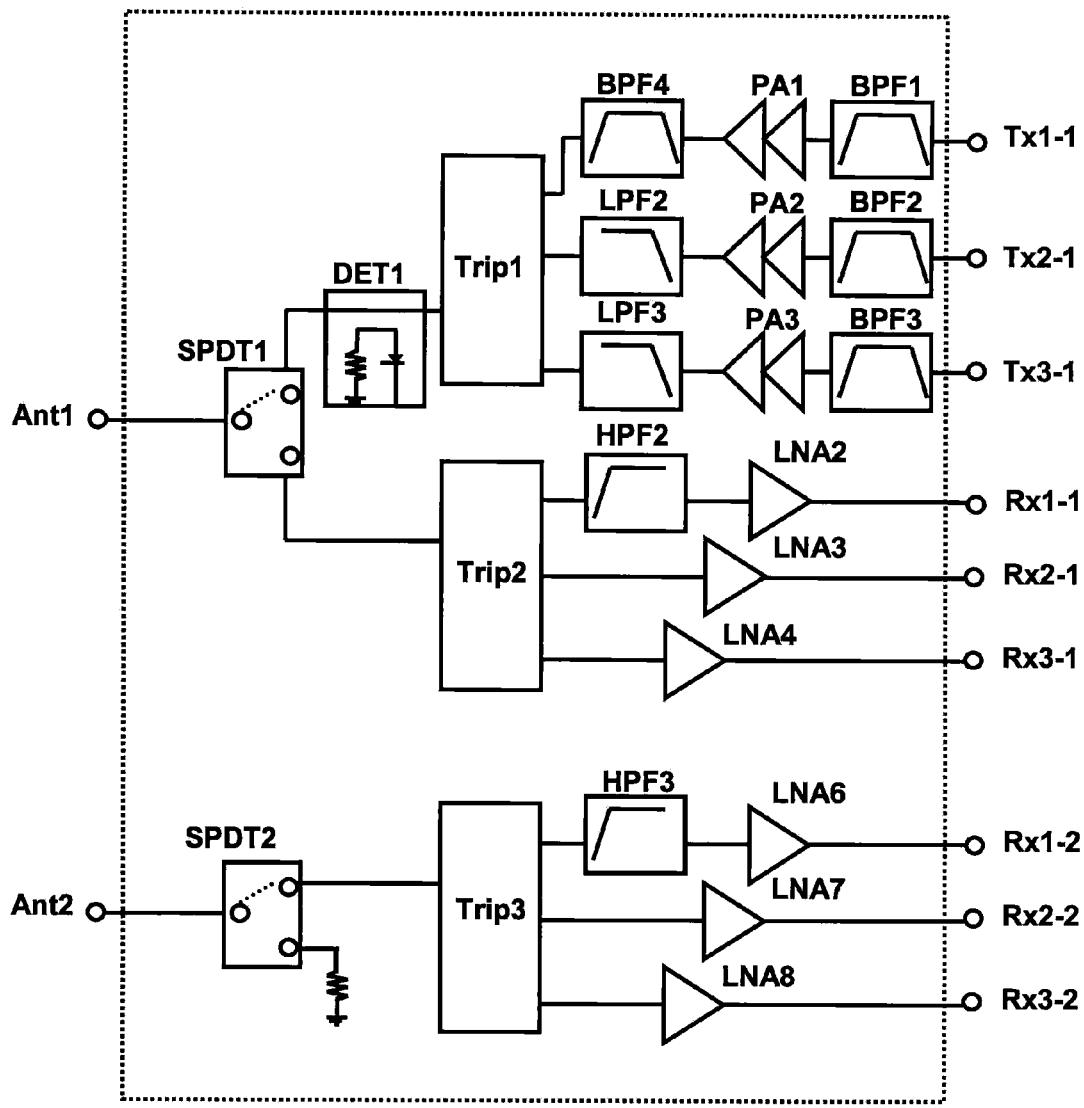
FIG. 16 is a circuit block diagram of a third embodiment of the high frequency circuit according to the present invention.

(Third Embodiment of High Frequency Circuit):

Another embodiment of the present invention will be described with reference to FIG. 16. The high frequency circuit illustrated in FIG. 16 is obtained by adding a sub-high frequency circuit (hereinafter referred to as a second sub-high frequency circuit) being another receiving path to the high frequency circuit illustrated in FIG. 15. The part of the high frequency circuit other than the added sub-high frequency circuit (hereinafter referred to as a first sub-high frequency circuit) is similar to the configuration of FIG. 15 and hence an explanation thereof is omitted. The configuration of the first sub-high frequency circuit is not limited to the configuration illustrated in FIG. 15; for example, the configuration illustrated in FIG. 1 may be used.

The high frequency circuit illustrated in FIG. 16 has the following configuration. The second sub-high frequency circuit includes: another antenna terminal Ant2 to be connected to an antenna different from the antenna included in the first sub-high frequency circuit; a fourth receiving terminal Rx1-2 for outputting a received signal of the first frequency band; a fifth receiving terminal Rx2-2 for outputting a received signal of the second frequency band; and a sixth receiving terminal Rx3-2 for outputting a received signal of the third frequency band. Further, the second sub-high frequency circuit includes a second receiving-side triplexer Trip3 which branches the receiving path connected to the another antenna terminal into receiving paths of the first, second and third frequency bands.

In the configuration illustrated in FIG. 16, a single pole double throw switch is used as the second switch circuit, and one of the switch terminals is connected via a resistor to the ground; but a single pole single throw (SPST) switch may be used instead, or no switch may be provided. The high frequency circuit illustrated in FIG. 16 includes two antenna terminals and the receiving terminal of the second sub-high frequency circuit receives a signal of the same communication system as the receiving terminal of the first sub-high frequency circuit. That is, the high frequency circuit illustrated in FIG. 16 has a configuration (hereinafter also referred to as 1T2R) which includes one transmitting terminal and two receiving terminals per communication system or per frequency band.

Such configuration can be used for diversity reception or 1T2R, or used as a high frequency circuit for a MIMO front-end module which is 2T3R obtained by combining 1T2R with a configuration (hereinafter referred to as 1T1R) including one transmitting terminal and one receiving terminal. When some more sub-high frequency circuits are added to increase the number of antenna terminals, the number of receiving terminals and the number of transmitting terminals, a configuration can also be provided which has a plurality of antenna terminals and includes a plurality of receiving terminals per communication system or per frequency band.

(Fourth Embodiment of High Frequency Circuit):

Another embodiment of the present invention will be described with reference to FIG. 17. The high frequency circuit illustrated in FIG. 17 has a configuration in which an input/output terminal for another communication system is further included in the high frequency circuit illustrated in FIG. 1. In the high frequency circuit illustrated in FIG. 17, the communication system using the first to third frequency bands supports WiMAX and another communication system supports Bluetooth (registered trademark). Excluding the part related to the another communication system, the configuration is similar to that of FIG. 1 and hence an explanation thereon is omitted. The section excluding the part related to the another communication system is not limited to the configuration illustrated in FIG. 1; for example, the configuration illustrated in FIG. 2 may be used.

Figure 17:
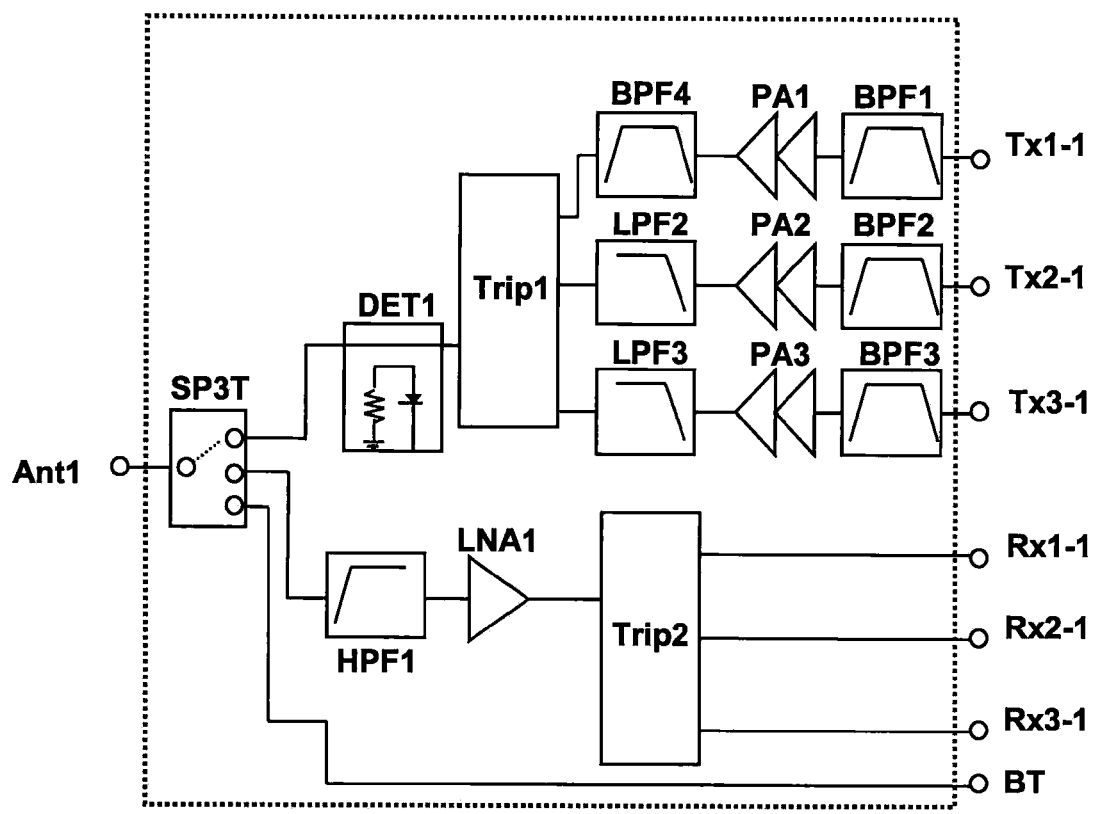
FIG. 17 is a circuit block diagram of a fourth embodiment of the high frequency circuit according to the present invention.

The high frequency circuit illustrated in FIG. 17 includes an input/output terminal BT for a communication system other than the communication system using the first frequency band, second frequency band and third frequency band. Further, the high frequency circuit includes a single pole three throw switch circuit SP3T as the switch circuit. The common terminal of the switch circuit SP3T is connected to the antenna terminal Ant1 and the three switch terminals are connected, respectively, to the transmitting-side triplexer Trip1, the first receiving-side triplexer Trip2 and the input/output terminal BT for another communication system.

The switch circuit SP3T performs switching between a connection of the antenna terminal Ant1 with the first, second and third transmitting terminals (Tx-1, Tx-2 and Tx-3) and a connection of the antenna terminal Ant1 with the first, second and third receiving terminals (Rx1-1, Rx2-1 and Rx3-1) and a connection of the antenna terminal Ant1 with the input/output terminal BT for the another communication system.

(Fifth Embodiment of High Frequency Circuit)

Figure 18:
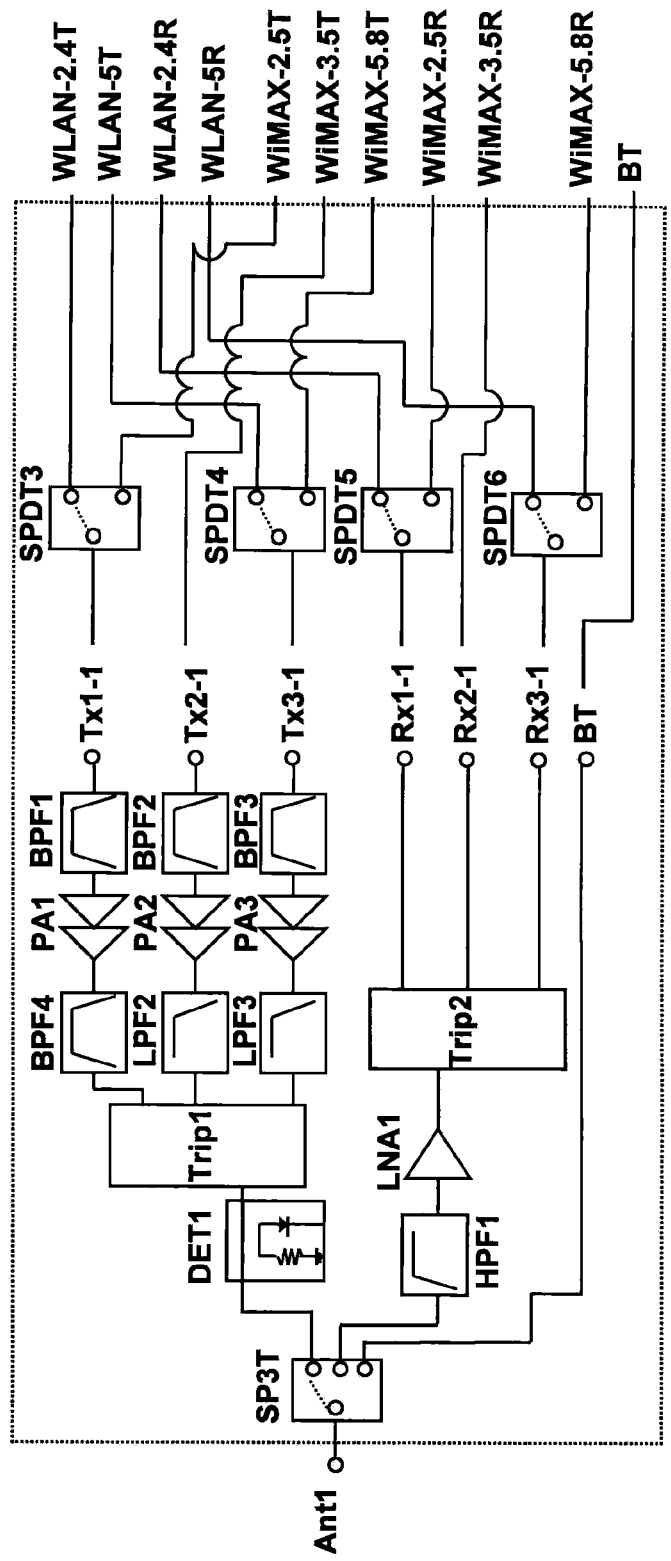
FIG. 18 is a circuit block diagram of a fifth embodiment of the high frequency circuit according to the present invention.

A high frequency circuit illustrated in FIG. 18 may be configured according to another embodiment. The high frequency circuit illustrated in FIG. 18 has a configuration in which switch circuits are additionally connected to the transmitting terminals and receiving terminals of the high frequency circuit illustrated in FIG. 17 to branch the transmitting paths and receiving paths; in this case, WiMAX of 2.5 GHz band, 3.5 GHz band and 5.8 GHz band, and wireless LAN of 2.4 GHz band and 5 GHz band, and Bluetooth are simultaneously in combination. The circuit extending from the antenna terminal Ant1 to the first to third transmitting terminals (Tx1-1, Tx-2 and Tx-3) and the first to third receiving terminals (Rx1-1, Rx2-1 and Rx3-1) and the input/output terminal BT for another communication system is similar to the configuration illustrated in FIG. 17 and hence an explanation thereof is omitted.

The above circuit section is not limited to the configuration illustrated in FIG. 17, and the configuration illustrated in FIG. 1 or 15 may be used. The first transmitting terminal Tx1-1 of 2.5 GHz band and the third transmitting terminal Tx3-1 of 5.8 GHz band are further connected via rear-stage switch circuits SPDT3 and SPDT4, respectively, to a plurality of sub-transmitting terminals. The plurality of sub-transmitting terminals connected to the first transmitting terminal Tx1-1 are a sub-transmitting terminal WLAN-2.4T of 2.4 GHz band of wireless LAN and a sub-transmitting terminal WiMAX-2.5T of 2.5 GHz band of WiMAX; and the plurality of sub-transmitting terminals connected to the third transmitting terminal Tx3-1 are a sub-transmitting terminal WLAN-5T of 5 GHz band of wireless LAN and a sub-transmitting terminal WiMAX-5.8T of 5.8 GHz band of WiMAX.

The first receiving terminal Rx1-1 of 2.5 GHz band and third receiving terminal Rx3-1 of 5.8 GHz band corresponding to the first transmitting terminal Tx1-1 and third transmitting terminal Tx3-1 are further connected via another rear-stage switch circuits SPDT5 and SPDT6, respectively, to a plurality of sub-receiving terminals. The word "correspond" used herein means that the same frequency band is used.

The multiple sub-receiving terminals connected to the first receiving terminal Rx1-1 are a sub-receiving terminal WLAN-2.4R of 2.4 GHz band of wireless LAN and a sub-receiving terminal WiMAX-2.5R of 2.5 GHz band of WiMAX; and the plurality of sub-receiving terminals connected to the third receiving terminal Rx3-1 are a sub-receiving terminal WLAN-5R of 5 GHz band of wireless LAN and a sub-receiving terminal WiMAX-5.8R of 5.8 GHz band of WiMAX.

The rear-stage switch circuit SPDT3 performs switching between a connection of the first transmitting terminal with the sub-transmitting terminal WLAN-2.4T and a connection of the first transmitting terminal with the sub-transmitting terminal WiMAX-2.5T; and the rear-stage switch circuit SPDT4 performs switching between a connection of the third transmitting terminal with the sub-transmitting terminal WLAN-5T and a connection of the third transmitting terminal with the sub-transmitting terminal WiMAX-5.8T. The rear-stage switch circuit SPDT5 performs switching between a connection of the first receiving terminal with the sub-receiving terminal WLAN-2.4R and a connection of the first receiving terminal with the sub-receiving terminal WiMAX-2.5R; and the rear-stage switch circuit SPDT6 performs switching between a connection of the third receiving terminal with the sub-receiving terminal WLAN-5R and a connection of the third receiving terminal with the sub-receiving terminal WiMAX-5.8R.

The frequency band of 3.5 GHz of WiMAX does not overlap with the frequency band of wireless LAN in service; thus, in the configuration illustrated in FIG. 18, no configuration for branching is provided for the second transmitting terminal Tx2-1 and second receiving terminal Rx2-1 of 3.5 GHz band. However, a switch circuit for branching into two paths may be provided, of course.

In FIG. 18, an example of high frequency circuit is illustrated in which the terminal BT of Bluetooth is provided and the high frequency circuit is shared by Bluetooth, WiMAX and wireless LAN. However, the terminal BT of Bluetooth may not be provided so that a high frequency circuit shared by WiMAX and wireless LAN is constructed.

The above sub-transmitting terminals and sub-receiving terminals are used as the transmitting terminal and receiving terminal of the high frequency circuit; and the second transmitting terminal Tx2-1 and second receiving terminal Rx2-1 of 3.5 GHz band with no sub-transmitting terminal or sub-receiving terminal connected thereto, and the terminal BT of Bluetooth are used directly as the transmitting terminal WiMAX-3.5T, WiMAX-3.5R and BT, respectively.

With such configuration, one high frequency circuit can be shared by WiMAX and wireless LAN using the same frequency bands. A plurality of sub-transmitting terminals and sub-receiving terminals may be connected not only to the first and third transmitting terminals and the first and third receiving terminals but also to a transmitting terminal or receiving terminal related to at least one of the first, second and third frequency bands.

(Sixth Embodiment of High Frequency Circuit):

Another embodiment will be described with reference to the drawings, in which the positional relationship between the triplexer and the switch circuit for switching between transmission and reception is different from that of the above embodiments. A high frequency circuit having a circuit block illustrated in FIG. 19 includes, similarly to the embodiment illustrated in FIG. 1, an antenna terminal Ant1, a first transmitting terminal Tx1-1 for inputting a transmit signal of 2.5 GHz band being first frequency band, a second transmitting terminal Tx2-1 for inputting a transmit signal of 3.5 GHz band being second frequency band, and a third transmitting terminal Tx3-1 for inputting a transmit signal of 5.8 GHz band being the third frequency band.

The high frequency circuit further includes a first receiving terminal Rx1-1 for outputting a received signal of 2.5 GHz band being first frequency band, a second receiving terminal Rx2-1 for outputting a received signal of 3.5 GHz band being second frequency band, and a third receiving terminal Rx3-1 for outputting a received signal of 5.8 GHz band being the third frequency band. A first triplexer Trip11 is connected to the antenna terminal Ant1 to branch a transmitting/receiving path connected to the antenna terminal into transmitting/receiving paths of the first, second and third frequency bands.

Further includes are: a first switch circuit SPDT11 that performs switching between a connection of the transmitting/receiving path of the first frequency band with the first transmitting terminal Tx1-1 and a connection of the transmitting/receiving path of the first frequency band with the first receiving terminal Rx1-1; a second switch circuit SPDT12 that performs switching between a connection of the transmitting/receiving path of the second frequency band with the second transmitting terminal Tx2-1 and a connection of the transmitting/receiving path of the second frequency band with the second receiving terminal Rx2-1; and a third switch circuit SPDT13 that performs switching between a connection of the transmitting/receiving path of the third frequency band with the third transmitting terminal Tx3-1 and a connection of the transmitting/receiving path of the third frequency band with the third receiving terminal Rx3-1.

With such configuration, switching between transmission and reception is made for radio communication using three frequency bands being the first, second and third frequency bands. Only one triplexer is required as the branching circuit. The high frequency circuit preferably further includes the following constituent elements.

A first amplifier circuit PA11 is connected between the first switch circuit SPDT11 and the first transmitting terminal Tx1-1 constituting the transmitting path of the first frequency band, and a first band-pass filter circuit BPF11 is arranged on the input-terminal side of the first amplifier circuit PA11, and a fourth band-pass filter circuit BPF14 is arranged on the output-terminal side thereof.

Further, a second amplifier circuit PA12 is connected between the second switch circuit SPDT12 and the second transmitting terminal Tx2-1 constituting the transmitting path of the second frequency band, and a second band-pass filter circuit BPF12 is arranged on the input-terminal side of the second amplifier circuit PA12, and a first low-pass filter circuit LPF12 is arranged on the output-terminal side thereof.

Further, a third amplifier circuit PA13 is connected between the third switch circuit SPDT13 and the third transmitting terminal Tx3-1 constituting the transmitting path of the third frequency band, and a third band-pass filter circuit BPF13 is arranged on the input-terminal side of the third amplifier circuit PA13, and a second low-pass filter circuit LPF13 is arranged in the output-terminal side thereof.

A first receiving terminal Rx1-1, second receiving terminal Rx2-1 and third receiving terminal Rx3-1 are connected to the receiving terminal sides of the first switch circuit SPDT11, second switch circuit SPDT12 and third switch circuit SPDT13, respectively, thereby forming receiving paths of the first frequency band, second frequency band and third frequency band. The function and the like of the band-pass filter circuits and low-pass filter circuits arranged in the preceding or rear stage of the first to third amplifier circuits (PA11 to PA13) is similar to those of the embodiment illustrated in FIG. 1, and hence an explanation thereof is omitted.

Figure 19:
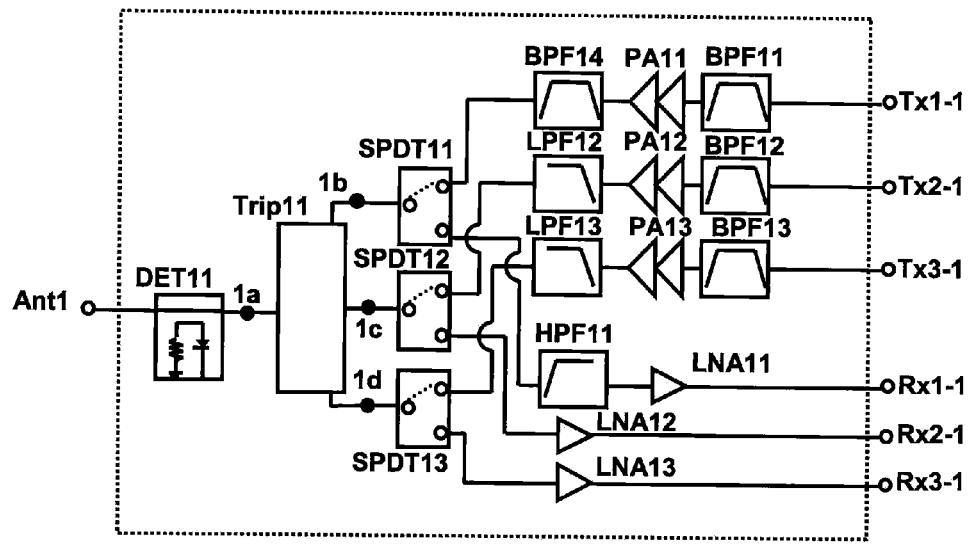
FIG. 19 is a circuit block diagram of a sixth embodiment of the high frequency circuit according to the present invention.

In the configuration illustrated in FIG. 19, the transmitting/receiving paths of different frequencies branched by the first Trip 11 are branched into respective transmitting and receiving paths by the first switch circuit SPDT11, second switch circuit SPDT12 and third switch circuit SPDT13.

In the example illustrated in FIG. 19, a single pole double throw switch circuit (SPDT) using field-effect transistor is used as the switch circuit.

The receiving-side configuration of the high frequency circuit illustrated in FIG. 19 is as follows: In a receiving path of the first frequency band formed between the first switch circuit SPDT11 and a first receiving terminal Rx1-1, there are arranged a first low-noise amplifier circuit LNA11 and a first high-pass filter circuit HPF11 disposed between the first low-noise amplifier circuit LNA11 and first switch circuit SPDT11.

In a receiving path of the second frequency band formed between the second switch circuit SPDT12 and a second receiving terminal Rx2-1, there is arranged a second low-noise amplifier circuit LNA12.

Further, in a receiving path of the third frequency band formed between the third switch circuit SPDT13 and a third receiving terminal Rx3-1, there is arranged a third low-noise amplifier circuit LNA13.

The first high-pass filter circuit HPF11 is adjusted to permit passing of a signal of the first frequency band (2.5 GHz of WiMAX), allowing attenuation of interfering wave of a frequency lower than the first frequency band produced by a mobile device such as mobile phone, so that the saturation of the low-noise amplifier circuit caused by the interfering wave is prevented. When it is desired to attenuate sharply a signal of a frequency lower than the first frequency band, the first high-pass filter may be replaced with a band-pass filter.

In the configuration of FIG. 19, the first triplexer capable of attenuating a signal of a frequency lower than the second frequency band is connected to the input side of the second low-noise amplifier circuit LNA12. Thus, there is no need to arrange a filter circuit corresponding to the first high-pass filter circuit HPF11, and thus signal loss in the path of the second frequency band can be suppressed.

The first triplexer capable of attenuating a signal of a frequency lower than the third frequency band is also connected to the input side of the third low-noise amplifier circuit LNA13. Thus, there is no need to arrange a filter circuit corresponding to the first high-pass filter circuit HPF11, and thus signal loss in the path of the third frequency band can be suppressed.

With the above configuration, a received signal of WiMAX received via the antenna goes through the antenna terminal Ant1, and is branched by the first triplexer Trip11, and goes through the switch circuits SPDT11 to 13, and is amplified by the first to third low-noise amplifier circuits LNA 11 to 13 and outputted to the first receiving terminal Rx1-1, second receiving terminal Rx2-1 or third receiving terminal Rx3-1. A transmit signal inputted to the first transmitting terminal Tx1-1, second transmitting terminal Tx2-1 or third transmitting terminal Tx3-1 is amplified by the amplifier circuits PA11 to PA13, and thereafter goes through the switch circuits SPDT 11 to 13, first triplexer Trip11 and antenna terminal Ant1, and is transmitted via the antenna.

Referring to the configuration of FIG. 19, a detection circuit DET11 is arranged between the first triplexer Trip11 and antenna terminal Ant1. In order to suppress an increase in the number of detection circuits, the detection circuit is preferably arranged in the path between the first triplexer Trip11 and antenna terminal Ant1 as shown in FIG. 19.

When the detection circuit produces harmonic wave, detection circuits may be arranged, respectively, between the first amplifier circuit PA11 and fourth band-pass filter circuit BPF14, between the second amplifier circuit PA12 and first low-pass filter circuit LPF12, and between the third amplifier circuit PA13 and second low-pass filter circuit LPF13. The above detection circuit, triplexer and the like may have the same configuration as those of the embodiment illustrated in FIG. 1.

Figure 20:
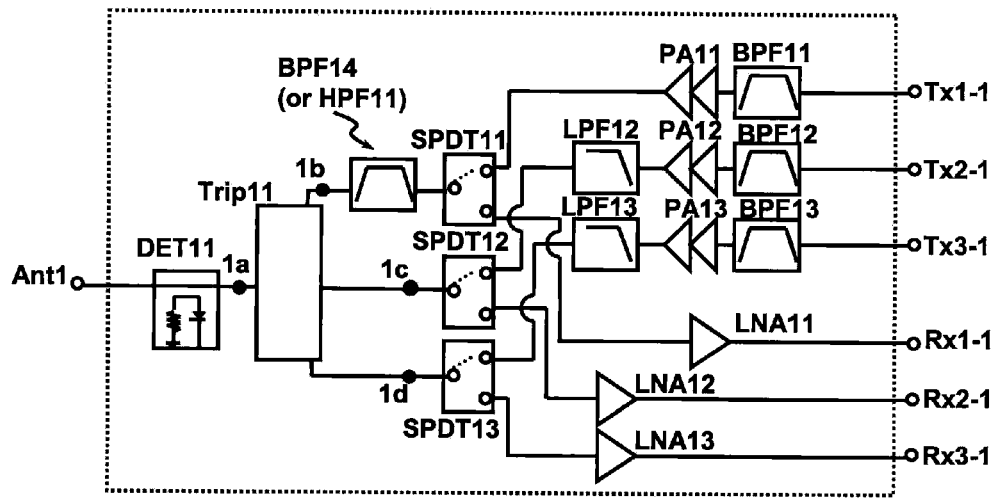
FIG. 20 is a circuit block diagram of a seventh embodiment of the high frequency circuit according to the present invention.

(Seventh Embodiment of High Frequency Circuit):

Another embodiment of the present invention will be described with reference to FIG. 20. The high frequency circuit illustrated in FIG. 20 is obtained by modifying the filter arrangement in the transmitting path and receiving path of the first frequency band in the high frequency circuit illustrated in FIG. 19. The sections for the second frequency band and third frequency band extending from the antenna terminal Ant1 through the first triplexer Trip11 and second switch circuit SPDT12 and third switch circuit SPDT13 to the second receiving terminal Rx2-1, second transmitting terminal Tx2-1, third receiving terminal Rx3-1 and third transmitting terminal Tx3-1, are similar to the configuration of FIG. 19, and hence an explanation thereof is omitted.

In the configuration of FIG. 19, the fourth band-pass filter circuit BPF14 is arranged between the first amplifier circuit PA11 and first switch circuit SPDT11, and the first high-pass filter circuit HPF11 is arranged between the first low-noise amplifier circuit LNA11 and first switch circuit SPDT11. However, in the configuration illustrated in FIG. 20, instead, a fourth band-pass filter circuit BPF14 or first high-pass filter circuit HPF11 is arranged between the first triplexer Trip11 and first switch circuit SPDT11. That is, in this case, one filter is shared by the transmitting-side and receiving-side of the first frequency band, so the number of filters can be reduced by one.

The first high-pass filter circuit HPF11 or first band-pass filter circuit BPF14 arranged between the first triplexer Trip11 and first switch circuit SPDT11 can prevent saturation of the low-noise amplifier circuit LNA11 caused by interfering wave of a frequency lower than the first frequency band produced by a mobile device such as mobile phone. Also, a signal of a frequency lower than the first frequency band produced by the amplifier circuit PA11 can be suppressed, so that interference to mobile phone systems is prevented.

In the case of WiMAX using the first frequency band of 2.5 GHz, the filter characteristic is adjusted to attenuate a signal of a frequency lower than 2.5 GHz. High-pass filter circuits can be made smaller in insertion loss than band-pass filter circuits; and band-pass filter circuits can have greater attenuation in bands adjacent to the passing band than high-pass filter circuits. Accordingly, the high-pass filter circuit HPF11 or band-pass filter circuit BPF14 is selected depending on desired characteristics.

(Eighth Embodiment of High Frequency Circuit):

Another embodiment having, similarly to the embodiment of FIG. 16, a sub-high frequency circuit added will be described with reference to FIG. 21. The object and function of the sub-high frequency circuit is similar to those of the embodiment illustrated in FIG. 16. The circuit section other than the sub-high frequency circuit is not limited to the configuration illustrated in FIG. 21, and the above described embodiments can be applied to the circuit section.

Between a second triplexer Trip12 and another antenna terminal Ant2, there are arranged a fourth low-noise amplifier circuit LNA14 and a second high-pass filter circuit HPF12 connected to the input side of the fourth low-noise amplifier circuit LNA14. With such configuration using a wide-band low-noise amplifier circuit, the number of low-noise amplifier circuits used in the second sub-high frequency circuit added can be reduced, so that downsizing can be achieved.

Figure 21:
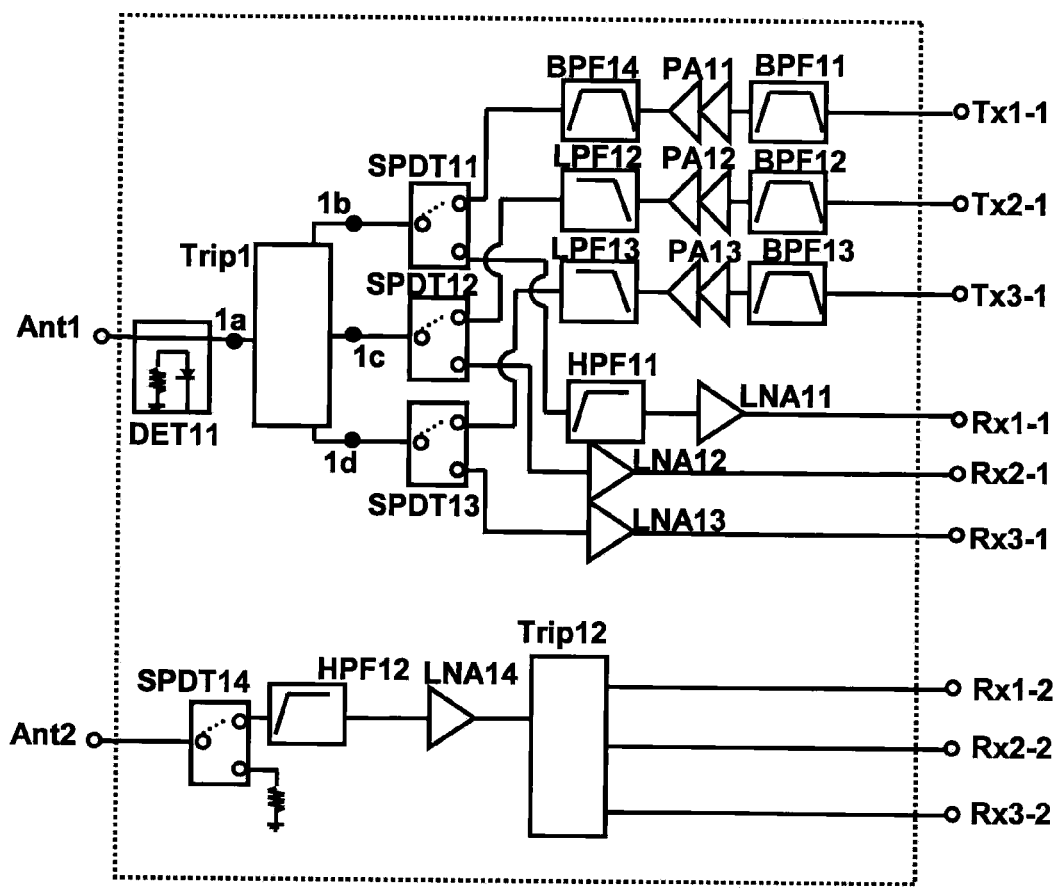
FIG. 21 is a circuit block diagram of an eighth embodiment of the high frequency circuit according to the present invention.
Figure 22:
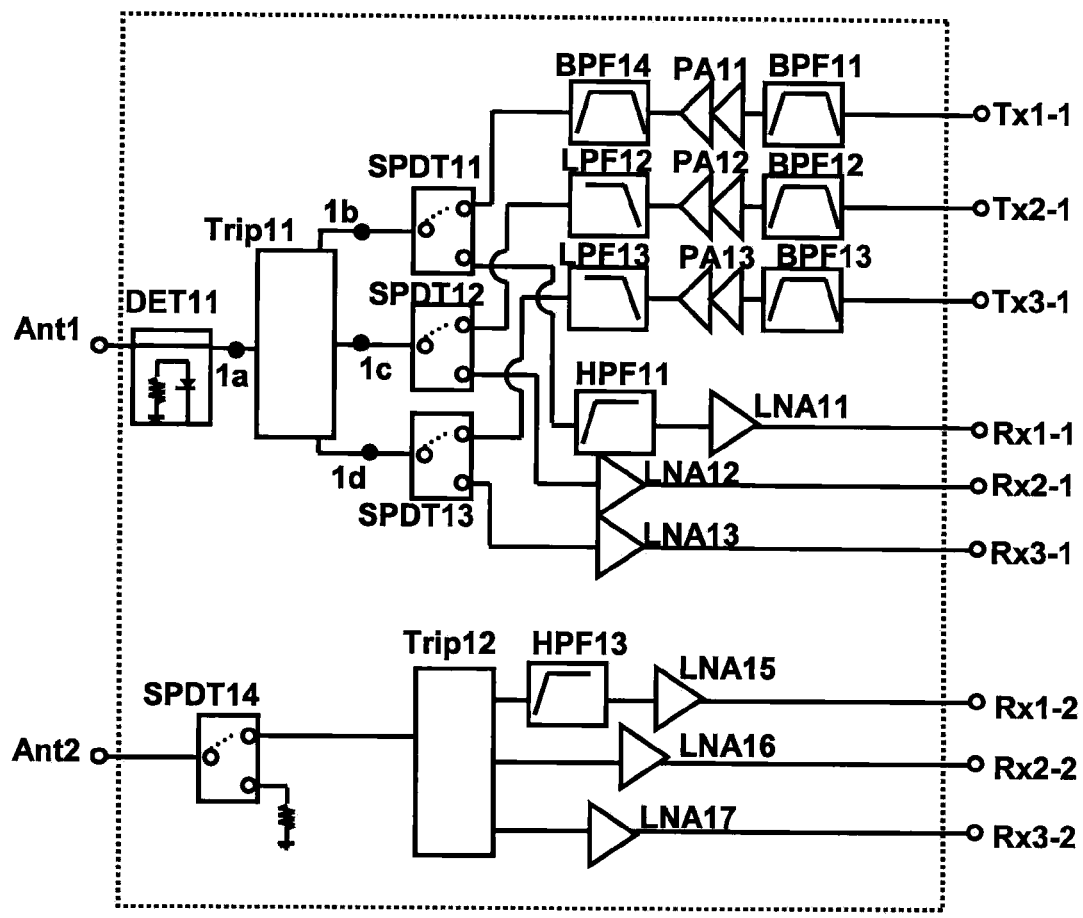
FIG. 22 is a view illustrating another exemplary configuration of a circuit block of the eighth embodiment of the high frequency circuit according to the present invention.

In the configuration illustrated in FIG. 21, a single pole double throw switch is used as a fourth switch circuit between another antenna terminal Ant2 and the second high-pass filter circuit HPF12, and one of the switch terminal is connected via a resistor to the ground. A single pole single throw (SPST) switch may be used as the fourth switch circuit, instead, or no switch may be provided. Further, as illustrated in FIG. 22, the same configuration as one illustrated in FIG. 16 may be used as the sub-high frequency circuit.

Figure 23:
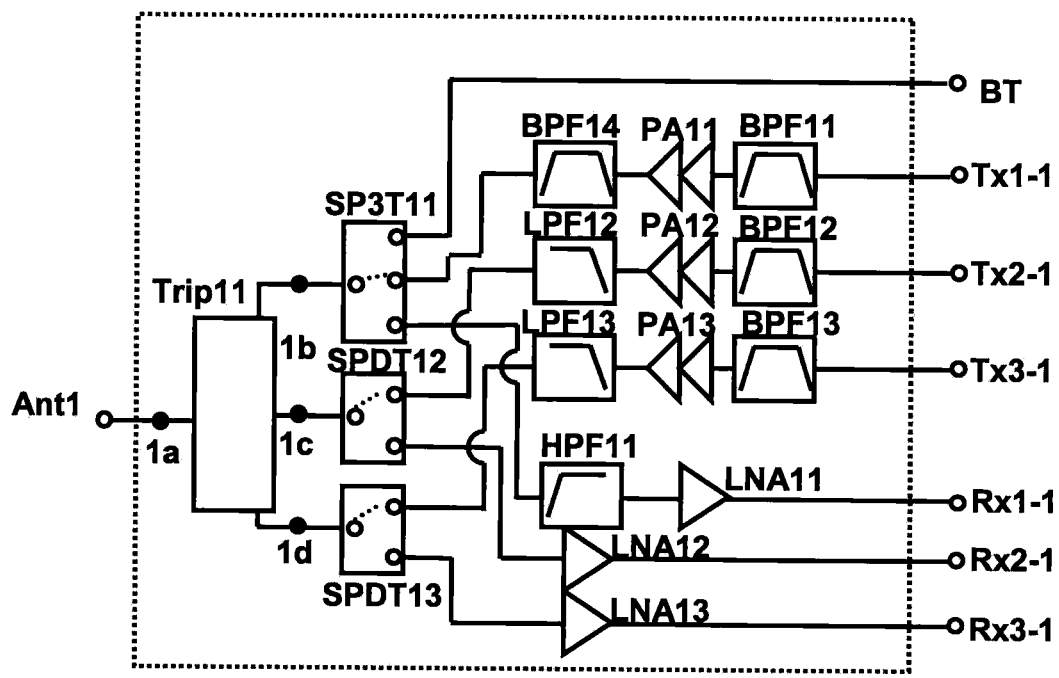
FIG. 23 is a circuit block diagram of a ninth embodiment of the high frequency circuit according to the present invention.

(Ninth Embodiment of High Frequency Circuit):

Another embodiment of the present invention will be described with reference to FIG. 23. The high frequency circuit illustrated in FIG. 23 is obtained by adding an input/output terminal for another communication system to the configuration of the high frequency circuit illustrated in FIG. 19. In the high frequency circuit illustrated in FIG. 23, the communication system using the first to third frequency bands supports WiMAX, and another communication system supports Bluetooth (registered trademark). Excluding the part related to the another communication system, the configuration is similar to that of FIG. 19 and hence an explanation thereof is omitted. The section excluding the part related to the another communication system is not limited to the configuration illustrated in FIG. 19; for example, the configuration illustrated in FIG. 20 may be used.

The high frequency circuit illustrated in FIG. 23 includes an input/output terminal BT for a communication system other than the communication system using the first frequency band, second frequency band and third frequency band. Further, the high frequency circuit includes a single pole three throw switch circuit SP3T11 as a first switch circuit. The common terminal of the switch circuit SP3T11 is connected to the first triplexer Trip11 and the three switch terminals are connected, respectively, to the input/output terminal BT for another communication system, the first transmitting terminal Tx1-1 and the first receiving terminal Rx1-1. The switch circuit SP3T11 performs switching between a connection of the antenna terminal Ant1 with the first transmitting terminal Tx1-1 and a connection of the antenna terminal Ant1 with the first receiving terminal Rx1-1 and a connection of the antenna terminal with the input/output terminal BT for the another communication system.

Figure 24:
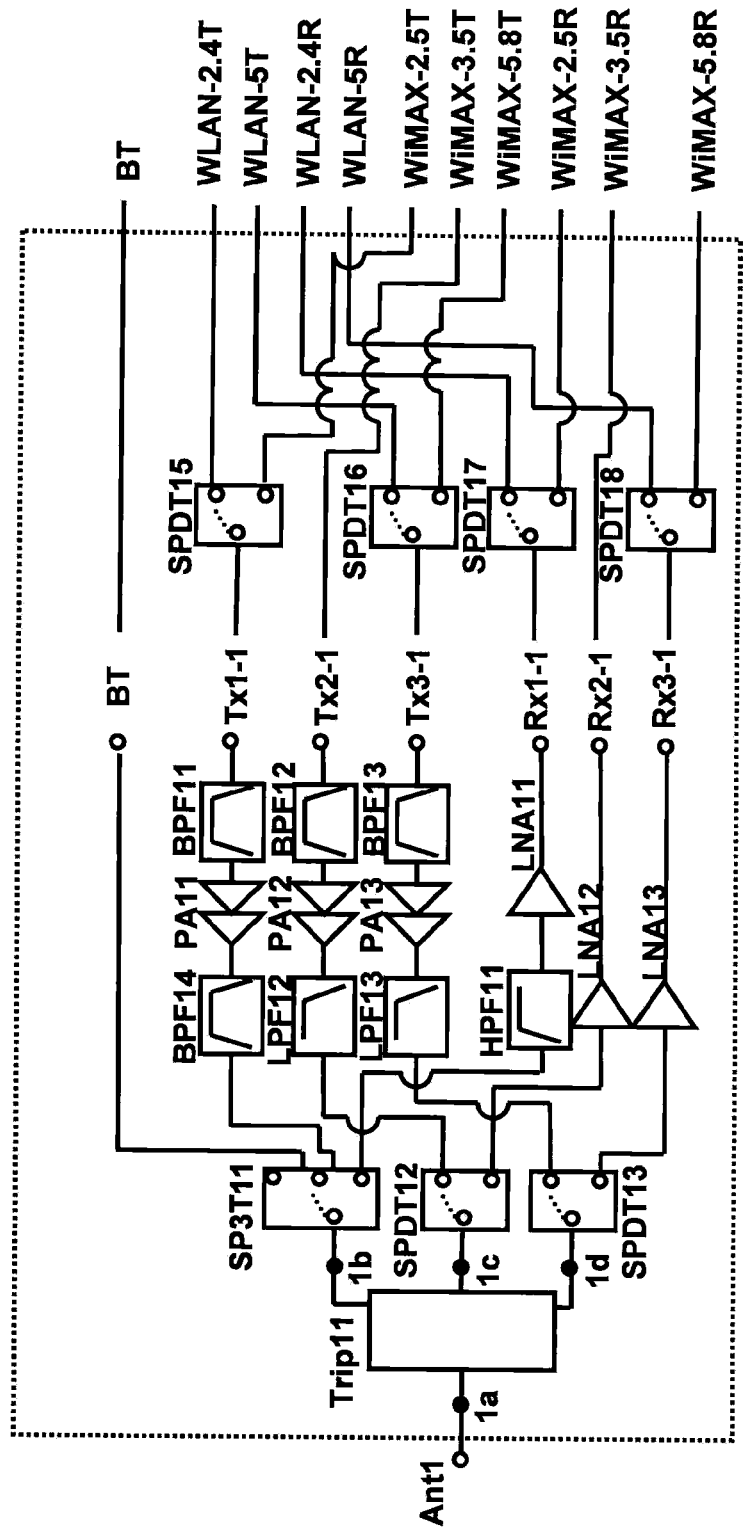
FIG. 24 is a circuit block diagram of a tenth embodiment of the high frequency circuit according to the present invention.

(Tenth Embodiment of High Frequency Circuit):

A high frequency circuit illustrated in FIG. 24 may be configured according to another embodiment. The high frequency circuit illustrated in FIG. 24 has a configuration in which switch circuits are, similarly to the high frequency circuit illustrated in FIG. 18, additionally connected to the transmitting terminals and receiving terminals of the high frequency circuit illustrated in FIG. 23 to branch the transmitting paths and receiving paths.

As described above, the present invention provides the high frequency circuit suitable for use in a front-end module using three frequency bands; for example, wireless LAN of 2.4 GHz band or WiMAX of 2.5 GHz band is used as the communication system using the first frequency band, and WiMAX of 3.5 GHz band is used as the communication system using the second frequency band, and wireless LAN of 5 GHz band or WiMAX of 5.8 GHz band is used as the communication system using the third frequency band. However, the high frequency circuit according to the present invention is not limited thereto and can be widely used in communication systems using three or more frequency bands.

In the case of WiMAX or a combination of WiMAX and wireless LAN, the total width of the frequency bands used for the communication system is smaller than 4 GHz, and the center frequency of the third frequency band is smaller than three times the center frequency of the first frequency band. Further, the center frequencies of each frequency band are 1 GHz or greater distant from each other. A configuration may also be used in which all the three frequency bands are used for WiMAX, or in which 2.4 GHz band and 5 GHz band are used for wireless LAN and 3.5 GHz band is used for WiMAX, or in which 2.5 GHz band and 3.5 GHz band are used for WiMAX and 5 GHz band is used for wireless LAN, or in which 2.4 GHz band is used for wireless LAN and 3.5 GHz band and 5.8 GHz band are used for WiMAX.

When a front-end module for WiMAX or a combination of wireless LAN and WiMAX is constructed using the inventive high frequency circuit, downsizing and cost reduction of the front-end module can be achieved.

The inventive high frequency circuit can be not only used in a front-end module for WiMAX or a combination of wireless LAN and WiMAX, but also used widely in many applications such as communication device front-end modules performing transmission and reception using three or more frequency bands. In the high frequency component according to the present invention, the high frequency circuit is constructed using an integral laminate comprising pluralities of layers provided with pattern electrodes and elements mounted on a surface of the laminate.

An integral laminate comprising pluralities of dielectric ceramic layers provided with pattern electrodes can be used, for example. When inductance elements and capacitance elements are formed as electrode patterns in the laminated body, downsizing can be achieved. Triplexers are constituted of a relatively large number of inductance elements and capacitance elements; thus the construction of triplexers using inductance elements and capacitance elements formed in the laminated body particularly contributes considerably to downsizing.

Figure 25:
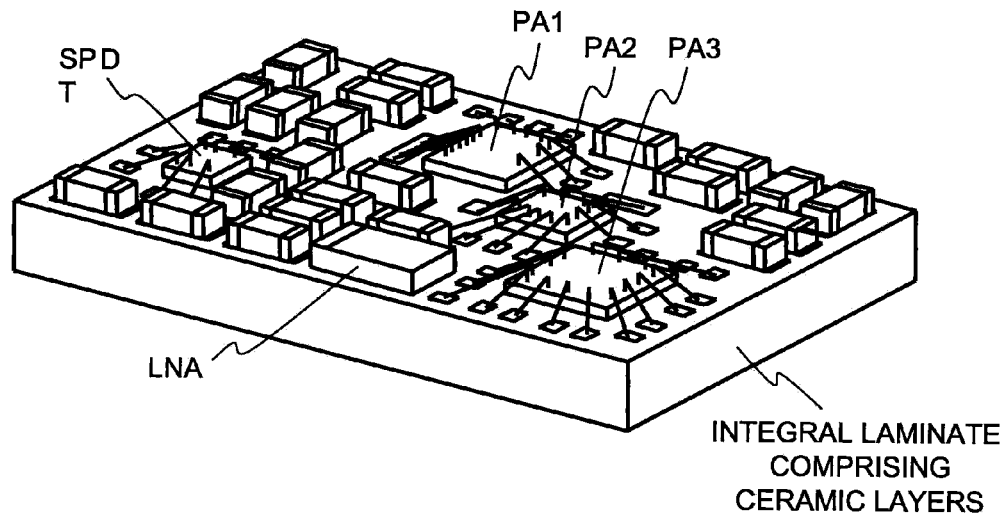
FIG. 25 is a perspective view of a high frequency component of an embodiment according to the present invention which is constructed using a ceramic laminated substrate.
Figure 26:
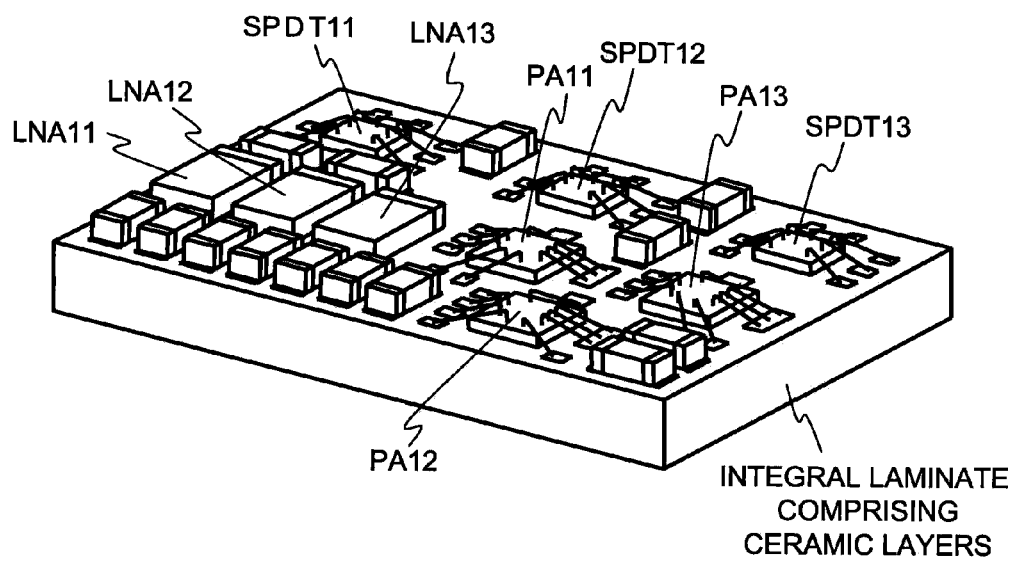
FIG. 26 is a perspective view of a high frequency component of another embodiment according to the present invention which is constructed using a ceramic laminated substrate.

(High Frequency Component):

There will be described an example in which a high frequency component including the inventive high frequency circuit is configured as a laminated body component (a component using a ceramic laminated substrate). FIGS. 25 and 26 are each a perspective view of a high frequency component of an embodiment according to the present invention in which a laminated body component is constructed using a ceramic laminated substrate. The ceramic laminated substrate is composed of ceramic dielectric material LTCC (Low Temperature Co-fired Ceramics) capable of low-temperature sintering at a temperature of 1000° C. or less, for example; the method of fabricating this is as follows: conductive paste of Ag, Cu or the like of a low resistivity is printed on a green sheet of a thickness of 10 μm to 200 μm to form a prescribed electrode pattern, and a plurality of green sheets are appropriately laminated integrally and sintered.

As the dielectric material, a material containing Al, Si and Sr as the main component and Ti, Bi, Cu, Mn, Na and K as the sub-component, or a material containing Al, Si and Sr as the main component and Ca, Pb, Na and K as the sub-component, or a material containing Al, Mg, Si and Gd, or a material containing Al, Si, Zr and Mg is used; the permittivity of the material is 5 to 15. Apart from the ceramic dielectric material, resin laminated substrate or laminated substrate composed of a composite material obtained by mixing resin and ceramic dielectric powder can also be used. A configuration may also be used in which the dielectric material of the ceramic substrate is changed, to one containing $Al_2O_3$ as the main component by use of HTCC (High Temperature Co-fired Ceramics) technique, and the transmission line and the like is formed of metal conductor such as tungsten or molybdenum capable of high-temperature sintering.

In each layer of the ceramic laminated substrate, pattern electrodes for inductance element, capacitance element, wiring and ground electrode are appropriately configured, and via hole electrodes are formed between the layers, whereby a desired circuit is constructed. Principally, circuit components capable of being constructed using an LC circuit are configured. Here, the triplexer, band-pass filter circuit, low-pass filter circuit and high-pass filter circuit are configured mainly in the ceramic laminated substrate. Alternatively, part of these circuits may be constructed using a chip element mounted on the upper surface of the ceramic laminated substrate.

On the ceramic laminated substrate illustrated in FIG. 25, semiconductor elements are mounted which are a switch circuit SPDT, three amplifier circuits PA1 to PA3, and a low-noise amplifier circuit LNA. On the ceramic laminated substrate illustrated in FIG. 26, semiconductor elements are mounted which are three switch circuits SPDT11 to SPDT13, three amplifier circuits PA11 to PA13, and three low-noise amplifier circuits LNA11 to LNA13. These elements are connected to the ceramic laminated substrate by wire bonding, LGA, BGA or the like, whereby the inventive high frequency circuit can be configured as a small-sized high frequency component.

Of course, the components mounted on the ceramic laminated substrate and the elements incorporated in the ceramic laminated substrate are connected to form a desired circuit, whereby the high frequency circuit is constructed. Apart from the above semiconductor elements, on the ceramic laminated substrate, other elements are appropriately mounted including chip capacitors, chip resistors, chip inductors and the like. These mounted elements are appropriately selected based on the relationship with the elements incorporated in the ceramic laminated substrate.

Figure 27:
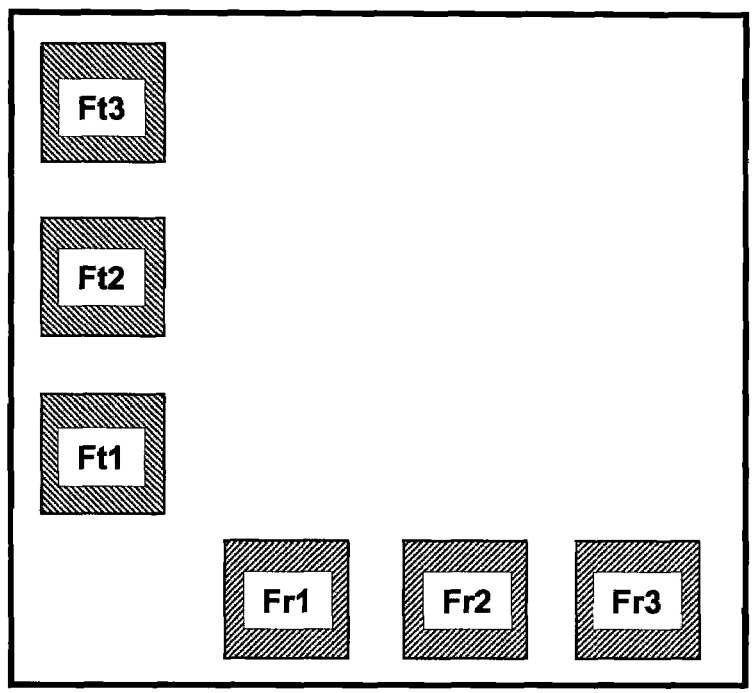
FIG. 27 is a view illustrating circuit arrangement in the high frequency component constructed using a ceramic laminated substrate.

FIG. 27 is a schematic diagram illustrating circuit arrangement in a substrate in-plane direction of a laminated substrate when the high frequency circuit illustrated in FIG. 15 is constructed in the ceramic laminated substrate. The transmitting-side triplexer and receiving-side triplexer are constructed in the laminated body; the transmitting-side triplexer is constituted of components Ft1 to Ft3, and the receiving-side triplexer are constituted of components Fr1 to Fr3. The transmitting-side triplexer and receiving-side triplexer each include a filter unit (Ft1, Fr1) permitting passing of a signal of the first frequency band, a filter unit (Ft2, Fr2) permitting passing of a signal of the second frequency band, and a filter unit (Ft3, Fr3) permitting passing of a signal of the third frequency band; these filter units are arranged so as not to overlap each other as seen from a laminate direction of the laminated body. Here, an illustration of circuits other than the triplexers is omitted.

In the configuration of FIG. 27, the transmitting-side triplexer having the filter units linearly disposed and the receiving-side triplexer having the filter units linearly disposed are arranged so that the disposition directions of the transmitting-side triplexer and receiving-side triplexer are orthogonal to each other to form an L-shape. Here, it is assumed that the first frequency band is used by wireless LAN of 2.4 GHz band, and the second frequency band higher than the first frequency band is used by WiMAX of 3.5 GHz band, and the third frequency band higher than the second frequency band is used by WiMAX of 5.8 GHz band. The filter unit Ft1 for 2.4 GHz band wireless LAN of the transmitting-side triplexer and the filter unit Fr1 for 2.4 GHz band wireless LAN of the receiving-side triplexer are in closest proximity to each other.

That is, in the positional relationship between the filter units as seen from a laminate direction of the laminated body, the filter unit used for wireless LAN of the transmitting-side triplexer and the filter unit used for WiMAX of the receiving-side triplexer are arranged so as not to be in closest proximity to each other. This prevents a transmit signal of wireless LAN from leaking to the receiving path of WiMAX and working as interfering wave. It is also preferable that the filter unit used for WiMAX of the transmitting-side triplexer is arranged so as not to be in closest proximity to the filter unit used for wireless LAN of the receiving-side triplexer, so that a transmit signal of WiMAX is prevented from leaking to the receiving path of wireless LAN and working as interfering wave.

The transmitting-side triplexer and receiving-side triplexer may not be arranged to form an L-shape as illustrated in FIG. 27, but may be arranged so that the disposition directions of the transmitting-side triplexer and receiving-side triplexer is parallel to each other. In this case, also, it is preferable that the filter unit used for wireless LAN of the transmitting-side triplexer and the filter unit used for WiMAX of the receiving-side triplexer are arranged so as not to be in closest proximity to each other, or the filter unit used for WiMAX of the transmitting-side triplexer and the filter unit used for wireless LAN of the receiving-side triplexer are arranged so as not to be in closest proximity to each other.

It is also preferable that the first to third receiving terminals arranged on the rear surface or the like of the high frequency component are collectively disposed on one side of the high frequency component which forms a rectangle as seen from a laminate direction; as a result, the connection of the high frequency component and the modulator/demodulator can be done efficiently in a small area.

When the high frequency component is used, a communication device can be constructed which can handle at least three different frequency bands, and cost reduction and downsizing of the communication device can be achieved. Further, the high frequency component can be widely used in mobile apparatuses and personal computers provided with radio communication function.

The invention claimed is:

1. A high frequency circuit used in a communication device that performs radio communication using at least a first frequency band, a second frequency band higher than the first frequency band, and a third frequency band higher than the second frequency band, the high frequency circuit comprising:

an antenna terminal to be connected to an antenna, a first transmitting terminal for inputting a transmit signal of the first frequency band, a second transmitting terminal for inputting a transmit signal of the second frequency band, and a third transmitting terminal for inputting a transmit signal of the third frequency band;

a first receiving terminal for outputting a received signal of the first frequency band, a second receiving terminal for outputting a received signal of the second frequency band, and a third receiving terminal for outputting a received signal of the third frequency band;

a switch circuit, connected to the antenna terminal, using a field-effect transistor for switching between a connection with the first, second and third transmitting terminals and a connection with the first, second and third receiving terminals;

a transmitting-side triplexer for branching a transmitting path connected to the switch circuit into transmitting paths of the first, second and third frequency bands; and a receiving-side triplexer for branching a receiving path connected to the switch circuit into receiving paths of the first, second and third frequency bands;

wherein at least one of the transmitting side triplexer and the receiving-side triplexer includes:

a first band-pass filter unit, disposed in a first path between a common terminal and a first branching terminal, and permitting passing of a signal of the first frequency band, a second band-pass filter unit, disposed in a second path between the common terminal and a second branching terminal, and permitting passing of a signal of the second frequency band and a third band-pass filter unit, disposed in a third path between the common terminal and a third branching terminal, and permitting passing of a signal of the third frequency band, wherein first, second and third parallel resonant circuits are arranged between the common terminal and the first, second and third band-pass filter units, respectively, and wherein a phase adjustment circuit is arranged between the band-pass filter unit and the corresponding parallel resonant circuit in at least two of the first, second and third paths.

2. The high frequency circuit according to claim 1, wherein a transmission line acting as the phase adjustment circuit is arranged in the first and second paths, and a high-pass filter acting as the phase adjustment circuit is arranged between the band-pass filter unit and the parallel resonant circuit on the third path.

3. The high frequency circuit according to claim 1, wherein a detection circuit is arranged between the transmitting-side triplexer and the switch circuit.

4. The high frequency circuit according to claim 1, wherein a first low-noise amplifier circuit is arranged between the receiving-side triplexer and the switch circuit.

5. A high frequency component including a high frequency circuit according to claim 1, wherein the high frequency circuit is constructed using an integral laminate comprising pluralities of dielectric ceramic layers provided with pattern electrodes and elements mounted on a surface of the integral laminate.

6. The high frequency component according to claim 5, wherein the transmitting-side triplexer and the receiving-side triplexer are formed in the integral laminate, wherein the band-pass filter units are arranged so as not to overlap each other as seen from a lamination direction of the integral laminate.

7. A high frequency circuit system comprising a first high frequency circuit according to the high frequency circuit of claim 1 acting as a first high frequency sub-circuit, wherein the receiving-side triplexer is a first receiving-side triplexer, the antenna is a first antenna, and the antenna terminal is a first antenna terminal, and wherein the high frequency circuit system further comprises a second high frequency circuit acting as a second high frequency sub-circuit including:

a second antenna terminal to be connected to another a second antenna;

a fourth receiving terminal for outputting a received signal of the first frequency band; a fifth receiving terminal for outputting a received signal of the second frequency band; a sixth receiving terminal for outputting a received signal of the third frequency band; and a second receiving-side triplexer for branching a receiving path connected to the second antenna terminal into receiving paths of the first, second and third frequency bands.

8. The high frequency circuit system according to claim 7, wherein a communication system using the first frequency band is wireless LAN or WiMAX, the communication system using the second frequency band is WiMAX, and the communication system using the third frequency band is wireless LAN or WiMAX.

9. A high frequency component comprising a high frequency circuit according to claim 8, wherein the high frequency circuit is constructed using an integral laminate comprising pluralities of dielectric ceramic layers provided with pattern electrodes and elements mounted on a surface of the integral laminate, wherein the transmitting-side triplexer, the first receiving-side triplexer, and the second receiving-side triplexer are formed in the integral laminate, wherein the transmitting-side triplexer, the first receiving-side triplexer, and the second receiving-side triplexer each include a band-pass filter unit which permits passing of a signal of the first frequency band, a band-pass filter unit which permits passing of a signal of the second frequency band and a band-pass filter unit which permits passing of a signal of the third frequency band, and wherein the band-pass filter units are arranged so that the wireless LAN band-pass filter unit of the transmitting-side triplexer and the WiMAX band-pass filter unit of the receiving-side triplexer are not brought into closest proximity to each other in a positional relation of the band-pass filter unit as seen from a lamination direction of the integral laminate, and the WiMAX band-pass filter unit of the transmitting-side triplexer and the wireless LAN band-pass filter unit of the receiving-side triplexer are not brought into closest proximity to each other in the positional relation of the band-pass filter unit as seen from the lamination direction of the integral laminate.

10. A communication device using a high frequency component according to claim 5.

11. A high frequency circuit used in a communication device that performs radio communication using at least a first frequency band, a second frequency band higher than the first frequency band, and a third frequency band higher than the second frequency band, the high frequency circuit comprising:

an antenna terminal to be connected to an antenna, a first transmitting terminal for inputting a transmit signal of the first frequency band, a second transmitting terminal for inputting a transmit signal of the second frequency band, and a third transmitting terminal for inputting a transmit signal of the third frequency band;

a first receiving terminal for outputting a received signal of the first frequency band, a second receiving terminal for outputting a received signal of the second frequency band, and a third receiving terminal for outputting a received signal of the third frequency band;

a triplexer, connected to the antenna terminal, for branching transmitting/receiving path connected to the antenna terminal into transmitting/receiving paths of the first, seconds and third frequency bands;

a first switch circuit using a field-effect transistor for switching between a connection of the transmitting/receiving path of the first frequency band with the first transmitting terminal and a connection of the transmitting/receiving path of the first frequency band with the first receiving terminal;

a second switch circuit using a field-effect transistor for switching between a connection of the transmitting/receiving path of the second frequency band with the second transmitting terminal and a connection of the transmitting/receiving path of the second frequency band with the second receiving terminal; and a third switch circuit using a field-effect transistor for switching between a connection of the transmitting/receiving path of the third frequency band with the third transmitting terminal and a connection of the transmitting/receiving path of the third frequency band with the third receiving terminal, wherein the triplexer includes:

a first band-pass filter unit, disposed in a first path between a common terminal and a first branching terminal, and permitting passing of a signal of the first frequency band;

a second band-pass filter unit, disposed in a second path between the common terminal and a second branching terminal, and permitting passing of a signal of the second frequency band; and a third band-pass filter unit, disposed in a third path between the common terminal and a third branching terminal, and permitting passing of a signal of the third frequency band, wherein first, second and third parallel resonant circuits are arranged between the common terminal and the first, second and third band-pass filter units, respectively, and wherein a phase adjustment circuit is arranged between the corresponding band-pass filter unit and the corresponding parallel resonant circuit on at least two of the first, second and third paths.

12. The high frequency circuit according to claim 11, wherein a transmission line acting as the phase adjustment circuit is arranged in the first and second paths, and a high-pass filter acting as the phase adjustment circuit is arranged between the band-pass filter unit and the parallel resonant circuit in the third path.

13. The high frequency circuit according to claim 11, wherein a first low-noise amplifier circuit is arranged between the first switch circuit and the first receiving terminal, a second low-noise amplifier circuit is arranged between the second switch circuit and the second receiving terminal, and a third low-noise amplifier circuit is arranged between the third switch circuit and the third receiving terminal, wherein a first amplifier circuit is connected to the first transmitting terminal, a second amplifier circuit is connected to the second transmitting terminal, and a third amplifier circuit is connected to the third transmitting terminal, wherein a first low-pass filter circuit is arranged on an output-terminal side of the second amplifier circuit, and a second low-pass filter circuit is arranged on the output-terminal side of the third amplifier circuit, and wherein a fourth band-pass filter circuit or a first high-pass filter circuit is arranged between the triplexer and the first switch circuit.

14. The high frequency circuit according to claim 11, wherein a detection circuit is arranged between the triplexer and the antenna terminal.

15. A high frequency circuit system comprising a first high frequency circuit according to the high frequency circuit of claim 11 acting as a first high frequency sub-circuit wherein the triplexer is a first triplexer, the antenna is a first antenna, and the antenna terminal is a first antenna terminal, wherein the high frequency circuit system further comprises a second high frequency circuit acting as a second high frequency sub-circuit, and wherein the second high frequency sub-circuit includes:

a second antenna terminal to be connected to a second antenna;

a fourth receiving terminal for outputting a received signal of the first frequency band;

a fifth receiving terminal for outputting a received signal of the second frequency band;

a sixth receiving terminal for outputting a received signal of the third frequency band; and a second triplexer for branching a receiving path connected to the second antenna terminal into receiving paths of the first, second and third frequency bands.

16. A high frequency component including a high frequency circuit according to claim 11, wherein the high frequency circuit is constructed using an integral laminate comprising pluralities of dielectric ceramic layers provided with pattern electrodes and elements mounted on a surface of the integral laminate.

17. A communication device using a high frequency component according to claim 16.

* * * * *